(12) United States Patent
Du et al.

(10) Patent No.: US 12,243,480 B2
(45) Date of Patent: Mar. 4, 2025

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Lili Du, Beijing (CN); Weiyun Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/997,498

(22) PCT Filed: Sep. 14, 2021

(86) PCT No.: PCT/CN2021/118279
§ 371 (c)(1),
(2) Date: Oct. 28, 2022

(87) PCT Pub. No.: WO2023/039721
PCT Pub. Date: Mar. 23, 2023

(65) Prior Publication Data
US 2024/0257731 A1  Aug. 1, 2024

(51) Int. Cl.
*G09G 3/3233* (2016.01)
*H10K 59/121* (2023.01)
(Continued)

(52) U.S. Cl.
CPC ....... *G09G 3/3233* (2013.01); *H10K 59/1216* (2023.02); *H10K 59/126* (2023.02);
(Continued)

(58) Field of Classification Search
CPC ......... G09G 3/3233; G09G 2300/0408; G09G 2300/0819; G09G 2300/0842;
(Continued)

(56) References Cited

U.S. PATENT DOCUMENTS 11,362,301 B2   6/2022  Li et al.
11,367,398 B2   6/2022  Huangfu et al.
(Continued)

FOREIGN PATENT DOCUMENTS

CN   109887956 A   6/2019
CN   110335564 A   10/2019
(Continued)

OTHER PUBLICATIONS

International Search Report and Written Opinion mailed Jun. 15, 2022; PCT/CN2021/118279.
(Continued)

*Primary Examiner* — Muhammad N Edun

(57) ABSTRACT

A display panel and a display device are provided. The display panel includes: a pixel unit including a pixel circuit and a light-emitting element, the pixel circuit including a driving transistor, a first reset transistor, and a second reset transistor; a first initialization signal line, connected to a first electrode of the first reset transistor; a first reset control signal line, connected to a gate electrode of the first reset transistor; and a second initialization signal line, connected to a first electrode of the second reset transistor, the first initialization signal line and the second initialization signal line are located in a same layer, and are located in a different layer from the first reset control signal line, the first reset control signal line is located between the first initialization signal line the second initialization signal line.

20 Claims, 27 Drawing Sheets

(51) Int. Cl.
*H10K 59/126* (2023.01)
*H10K 59/131* (2023.01)
*H10K 59/65* (2023.01)

(52) U.S. Cl.
CPC .......... *H10K 59/131* (2023.02); *H10K 59/65* (2023.02); *G09G 2300/0408* (2013.01); *G09G 2300/0426* (2013.01); *G09G 2300/0819* (2013.01); *G09G 2300/0842* (2013.01); *G09G 2310/08* (2013.01); *G09G 2320/0233* (2013.01); *G09G 2320/045* (2013.01)

(58) Field of Classification Search
CPC ... G09G 2300/0426; G09G 2320/0233; G09G 2310/08; G09G 2320/045; H10K 59/131; H10K 59/126; H10K 59/1216; H10K 59/65

See application file for complete search history.

(56) References Cited

U.S. PATENT DOCUMENTS

| | | | |
|---|---|---|---|
| 11,374,081 | B2 | 6/2022 | Wang et al. |
| 11,469,291 | B2 | 10/2022 | Diao et al. |
| 2017/0365213 | A1 | 12/2017 | Rieutort-Louis et al. |
| 2019/0108789 | A1 | 4/2019 | Tsuge |
| 2019/0237019 | A1* | 8/2019 | Gao .................... G09G 3/3233 |
| 2021/0020704 | A1 | 1/2021 | Kim |
| 2021/0150980 | A1* | 5/2021 | Wei ..................... G09G 3/3233 |
| 2021/0193780 | A1* | 6/2021 | Diao ................... H10K 59/1216 |
| 2021/0358407 | A1* | 11/2021 | Xu ..................... H10K 59/1216 |
| 2022/0293692 | A1 | 9/2022 | Xu et al. |
| 2022/0310010 | A1 | 9/2022 | Cheng et al. |
| 2023/0038017 | A1 | 2/2023 | Wei et al. |

FOREIGN PATENT DOCUMENTS

| | | |
|---|---|---|
| CN | 111128080 A | 5/2020 |
| CN | 111146261 A | 5/2020 |
| CN | 111627341 A | 9/2020 |
| CN | 111682058 A | 9/2020 |
| CN | 112017593 A | 12/2020 |
| CN | 112037716 A | 12/2020 |
| CN | 112466245 A | 3/2021 |
| CN | 112687704 A | 4/2021 |
| CN | 113053981 A | 6/2021 |
| CN | 113257885 A | 8/2021 |
| CN | 113555400 A | 10/2021 |
| CN | 113674693 A | 11/2021 |
| JP | 2010139699 A | 6/2010 |
| WO | 2021/102791 A1 | 3/2021 |
| WO | 2021/102904 A1 | 3/2021 |

OTHER PUBLICATIONS

International Search Report and Written Opinion mailed Nov. 30, 2022; PCT/CN2022/082809.
International Search Report mailed Jun. 15, 2022; PCT/CN2021/118279.
International Search Report mailed Sep. 1, 2022; PCT/CN2022/096404.
The Extended European Search Report dated Nov. 19, 2024; Appln. No. 21957012.4.
The Extended European Search Report dated Dec. 13, 2024; Appln. No. 22868733.1.

* cited by examiner

A5-B5

A6-B6

DISPLAY PANEL AND DISPLAY DEVICE

This application is National Stage of International Application No. PCT/CN2021/118279, filed Sep. 14, 2021, the entirety of which is hereby incorporated herein by reference.

TECHNICAL FIELD

At least one embodiment of the present disclosure relates to a display panel and a display device.

BACKGROUND

With the continuous development of display technology, active-matrix organic light-emitting diode (AMOLED) display technology has been more and more used in mobile phones, tablet computers, digital cameras and other display devices due to its advantages such as self-luminescence, wide viewing angle, high contrast, low power consumption, and high response speed, and the like.

An under-screen camera technology is a brand-new technology proposed to increase the screen-to-body ratio of a display device.

SUMMARY

At least one embodiment of the present disclosure provides a display panel and a display device.

In one aspect, at least one embodiment of the present disclosure provides a display panel, including: a base substrate; a pixel unit, located on the base substrate, including a pixel circuit and a light-emitting element, the pixel circuit being configured to drive the light-emitting element, the pixel circuit includes a driving transistor, a first reset transistor, and a second reset transistor, the first reset transistor being connected to the driving transistor and being configured to reset a gate electrode of the driving transistor; a first initialization signal line, connected to a first electrode of the first reset transistor and configured to provide a first initialization signal to the pixel unit; a first reset control signal line, connected to a gate electrode of the first reset transistor; and a second initialization signal line, a first electrode of the second reset transistor being connected to the second initialization signal line, a second electrode of the second reset transistor being connected to a first electrode of the light-emitting element, and being configured to reset the first electrode of the light-emitting element, the first initialization signal line and the second initialization signal line are located in a same layer, and are located in a different layer from the first reset control signal line, an orthographic projection of the first reset control signal line on the base substrate is located between an orthographic projection of the first initialization signal line on the base substrate and an orthographic projection of the second initialization signal line on the base substrate.

In some embodiments of the present disclosure, the display panel further includes a first power supply line and a first connection electrode, the first power supply line is configured to provide a constant first voltage signal to the pixel unit, the pixel circuit further includes a first light-emitting control transistor and a storage capacitor, a first electrode of the storage capacitor is connected to the gate electrode of the driving transistor, and a second electrode of the storage capacitor is connected to the first power supply line through the first connection electrode, the first connection electrode is connected to a first electrode of the first light-emitting control transistor through a first via hole, and the first connection electrode is connected to the second electrode of the storage capacitor through a second via hole.

In some embodiments of the present disclosure, the display panel further includes a second connection electrode and a third connection electrode, the first power supply line is connected to the first connection electrode through a third via hole, the pixel circuit further includes a second light-emitting control transistor, and a first electrode of the second light-emitting control transistor is connected to the driving transistor, the third connection electrode is connected to the second connection electrode through a fourth via hole, the second connection electrode is connected to a second electrode of the second light-emitting control transistor through a fifth via hole, the fourth via hole and the third via hole are arranged in a first direction.

In some embodiments of the present disclosure, a distance from the fourth via hole to the first initialization signal line is equal to a distance from the third via hole to the first initialization signal line.

In some embodiments of the present disclosure, the display panel further includes a fourth connection electrode and a shield electrode, the gate electrode of the driving transistor is connected to a second electrode of the first reset transistor through the fourth connection electrode, the shield electrode and the first power supply line are of an integral structure, an orthographic projection of the shield electrode on the base substrate covers an orthographic projection of the fourth connection electrode on the base substrate.

In some embodiments of the present disclosure, the fourth connection electrode is connected to the second electrode of the first reset transistor through a sixth via hole, the orthographic projection of the shield electrode on the base substrate covers an orthographic projection of the sixth via hole on the base substrate.

In some embodiments of the present disclosure, the orthographic projection of the shield electrode on the base substrate at least partially overlaps with an orthographic projection of the second electrode of the first reset transistor on the base substrate.

In some embodiments of the present disclosure, the display panel further includes a data line, the data line is configured to provide a data signal to the pixel unit, the data line and the first power supply line are located in a same layer.

In some embodiments of the present disclosure, the display panel further includes a block and a fifth connection electrode, the pixel circuit further includes a threshold compensation transistor, the threshold compensation transistor includes a first channel, a second channel, and a conductive connection portion connecting the first channel and the second channel, the fifth connection electrode is connected to the first power supply line through a seventh via hole, and the fifth connection electrode is connected to the block, an orthographic projection of the block on the base substrate at least partially overlaps with an orthographic projection of the conductive connection portion on the base substrate, the block is configured to block the conductive connection portion of the pixel unit where the block is located.

In some embodiments of the present disclosure, the display panel further includes a sixth connection electrode, the pixel circuit further includes a data writing transistor, the data line is connected to the data writing transistor through the sixth connection electrode, the sixth connection electrode is connected to the data line through an eighth via hole, and the seventh via hole and the eighth via hole are arranged in a first direction.

In some embodiments of the present disclosure, a distance from the seventh via hole to the first initialization signal line is equal to a distance from the eighth via hole to the first initialization signal line.

In some embodiments of the present disclosure, the data line includes a first data line and a second data line, the first data line extends in a second direction, the second data line includes a first portion extending in the first direction, and the first portion of the second data line is located between the first initialization signal line and the sixth connection electrode.

In some embodiments of the present disclosure, the display panel further includes a seventh connection electrode, the first initialization signal line is connected to the first electrode of the first reset transistor through the seventh connection electrode, the seventh connection electrode is connected to the first initialization signal line through a ninth via hole, and the seventh connection electrode is connected to the first electrode of the first reset transistor through a tenth via hole, the first initialization signal line extends in a first direction, and the seventh connection electrode is inclined with respect to the first initialization signal line.

In some embodiments of the present disclosure, an included angle between an extension direction of the seventh connection electrode and an extension direction of the first initialization signal line is an acute angle.

In some embodiments of the present disclosure, the included angle is greater than or equal to 30 degrees and less than or equal to 60 degrees.

In some embodiments of the present disclosure, the first reset transistor includes a first channel and a second channel, lines connecting centers of the ninth via hole, the first channel, and the second channel form an acute triangle, and lines connecting centers of the tenth via hole, the first channel, and the second channel form an obtuse triangle.

In some embodiments of the present disclosure, the first initialization signal line includes a first overlap portion overlapping with the first electrode of the first reset transistor and a second overlap portion overlapping with a second electrode of the first reset transistor, and the ninth via hole is located between the first overlap portion and the second overlap portion.

In some embodiments of the present disclosure, an orthographic projection of the ninth via hole on the base substrate does not overlap with the orthographic projection of the first electrode of the first reset transistor on the base substrate, and does not overlap with an orthographic projection of a second electrode of the first reset transistor on the base substrate.

In some embodiments of the present disclosure, the ninth via hole and the tenth via hole are located on a same side of the first reset control signal line.

In some embodiments of the present disclosure, the first reset control signal line is located in a first conductive layer, the first initialization signal line and the second initialization signal line are located in a second conductive layer, and the seventh connection electrode is located in a third conductive layer, the first conductive layer is closer to the base substrate than the second conductive layer, and the second conductive layer is closer to the substrate than the third conductive layer.

In some embodiments of the present disclosure, the display panel further includes an eighth connection electrode, the eighth connection electrode is connected to the second initialization signal line and the first electrode of the second reset transistor, respectively, and the seventh connection electrode is inclined with respect to the eighth connection electrode.

In some embodiments of the present disclosure, an included angle between an extension direction of the seventh connection electrode and an extension direction of the eighth connection electrode is an acute angle.

In some embodiments of the present disclosure, the angle between the extension direction of the seventh connection electrode and the extension direction of the eighth connection electrode is greater than or equal to 30 degrees and less than or equal to 60 degrees.

In some embodiments of the present disclosure, the ninth via hole and the eighth connection electrode are disposed on two opposite sides of the first electrode of the first reset transistor, respectively.

In some embodiments of the present disclosure, the display panel includes a first display region and a second display region, the first display region is located on at least one side of the second display region, the pixel unit includes a first pixel unit and a second pixel unit, both the pixel circuit and the light-emitting element of the first pixel unit are located in the first display region, the pixel circuit of the second pixel unit is located in the first display region, and the light-emitting element of the second pixel unit is located in the second display region, the pixel circuit of the second pixel unit is connected to the light-emitting element of the second pixel unit through a conductive line.

In some embodiments of the present disclosure, an orthographic projection of the conductive line on the base substrate partially overlaps with an orthographic projection of the pixel circuit of the first pixel unit on the base substrate.

In some embodiments of the present disclosure, an orthographic projection of at least one selected from the group consisting of the eighth via hole, the seventh via hole, the fourth via hole, and the third via hole on the base substrate does not overlap with an orthographic projection of the conductive line on the base substrate.

At least one embodiment of the present disclosure further provides a display device including any one of the display panels as described above.

In another aspect, at least one embodiment of the present disclosure provides a display panel, including: a base substrate; a pixel unit, located on the base substrate, including a pixel circuit and a light-emitting element, the pixel circuit being configured to drive the light-emitting element, the pixel circuit including a driving transistor and a first reset transistor, the first reset transistor being connected to the driving transistor and being configured to reset a gate electrode of the driving transistor; a first initialization signal line, connected to a first electrode of the first reset transistor and configured to provide a first initialization signal to the pixel unit; a first connection electrode, the first initialization signal line being connected to a first electrode of the first reset transistor through the first connection electrode; the first connection electrode is connected to the first initialization signal line through a first via hole, the first connection electrode is connected to the first electrode of the first reset transistor through a first via hole, the first initialization signal line extends in a first direction, the first connection electrode is inclined with respect to the first initialization signal line.

In some embodiments, an included angle between an extension direction of the first connection electrode and an extension direction of the first initialization signal line is an acute angle.

In some embodiments, the included angle is greater than or equal to 30 degrees and less than or equal to 60 degrees.

In some embodiments, the first reset transistor includes a first channel and a second channel, lines connecting centers of the first via hole, the first channel, and the second channel form an acute triangle, and lines connecting centers of the second via hole, the first channel, and the second channel form an obtuse triangle.

In some embodiments, the first initialization signal line includes a first overlap portion overlapping with the first electrode of the first reset transistor and a second overlap portion overlapping with a second electrode of the first reset transistor, and the first via hole is located between the first overlap portion and the second overlap portion.

In some embodiments, an orthographic projection of the first via hole on the base substrate does not overlap with the orthographic projection of the first electrode of the first reset transistor on the base substrate, and does not overlap with an orthographic projection of a second electrode of the first reset transistor on the base substrate.

In some embodiments, the display panel further includes a first reset control signal line and a second initialization signal line, the pixel unit further includes a second reset transistor, a first electrode of the second reset transistor is connected to the second initialization signal line, a second electrode of the second reset transistor is connected to a first electrode of the light-emitting element, and is configured to reset the first electrode of the light-emitting element, the first reset control signal line is connected to a gate electrode of the first reset transistor; the first initialization signal line and the second initialization signal line are located in a same layer, and are located in a different layer from the first reset control signal line, an orthographic projection of the first reset control signal line on the base substrate is located between an orthographic projection of the first initialization signal line on the base substrate and an orthographic projection of the second initialization signal line on the base substrate.

In some embodiments, the first via hole and the second via hole are located on a same side of the first reset control signal line.

In some embodiments, the first reset control signal line is located in a first conductive layer, the first initialization signal line and the second initialization signal line are located in a second conductive layer, and the first connection electrode is located in a third conductive layer, the first conductive layer is closer to the base substrate than the second conductive layer, and the second conductive layer is closer to the substrate than the third conductive layer.

In some embodiments, the display panel further includes a second connection electrode, the second connection electrode is connected to the second initialization signal line and the first electrode of the second reset transistor, respectively, and the first connection electrode is inclined with respect to the second connection electrode.

In some embodiments, an included angle between an extension direction of the first connection electrode and an extension direction of the second connection electrode is an acute angle.

In some embodiments, the angle between the extension direction of the first connection electrode and the extension direction of the second connection electrode is greater than or equal to 30 degrees and less than or equal to 60 degrees.

In some embodiments, the first via hole and the second connection electrode are disposed on two opposite sides of the first electrode of the first reset transistor, respectively.

In some embodiments, the display panel further includes a third connection electrode, a first power supply line, and a shield electrode, the gate electrode of the driving transistor is connected to a second electrode of the first reset transistor through the third connection electrode, the first power supply line is configured to provide a constant first voltage signal to the pixel unit, the shield electrode and the first power supply line are of an integral structure, an orthographic projection of the shield electrode on the base substrate covers an orthographic projection of the third connection electrode on the base substrate.

In some embodiments, the third connection electrode is connected to the second electrode of the first reset transistor through a third via hole, the orthographic projection of the shield electrode on the base substrate covers an orthographic projection of the third via hole on the base substrate.

In some embodiments, the orthographic projection of the shield electrode on the base substrate at least partially overlaps with an orthographic projection of the second electrode of the first reset transistor on the base substrate.

In some embodiments, the display panel further includes a fourth connection electrode, the pixel circuit further includes a first light-emitting control transistor and a storage capacitor, a first electrode of the storage capacitor is connected to the gate electrode of the driving transistor, and a second electrode of the storage capacitor is connected to the first power supply line through the fourth connection electrode, the fourth connection electrode is connected to a first electrode of the first light-emitting control transistor through a fourth via hole, and the fourth connection electrode is connected to the second electrode of the storage capacitor through a fifth via hole.

In some embodiments, the display panel further includes a fifth connection electrode and a sixth connection electrode, the first power supply line is connected to the fourth connection electrode through a sixth via hole, the pixel circuit further includes a second light-emitting control transistor, and a first electrode of the second light-emitting control transistor is connected to the driving transistor, the sixth connection electrode is connected to the fifth connection electrode through a seventh via hole, the fifth connection electrode is connected to a second electrode of the second light-emitting control transistor through an eighth via hole, the seventh via hole and the sixth via hole are arranged in a first direction.

In some embodiments, a distance from the seventh via hole to the first initialization signal line is equal to a distance from the sixth via hole to the first initialization signal line.

In some embodiments, the display panel further includes a block and a seventh connection electrode, the pixel circuit further includes a threshold compensation transistor, the threshold compensation transistor includes a first channel, a second channel, and a conductive connection portion connecting the first channel and the second channel, the seventh connection electrode is connected to the first power supply line through a ninth via hole, and the seventh connection electrode is connected to the block, an orthographic projection of the block on the base substrate at least partially overlaps with an orthographic projection of the conductive connection portion on the base substrate, the block is configured to block the conductive connection portion of the pixel unit where the block is located.

In some embodiments, the display panel further includes a data line and an eighth connection electrode, the pixel circuit further includes a data writing transistor, the data line is configured to provide a data signal to the pixel unit, the data line is connected to the data writing transistor through the eighth connection electrode, the eighth connection electrode is connected to the data line through a tenth via hole, and the ninth via hole and the tenth via hole are arranged in a first direction.

In some embodiments, a distance from the ninth via hole to the first initialization signal line is equal to a distance from the tenth via hole to the first initialization signal line.

In some embodiments, the data line includes a first data line and a second data line, the first data line extends in a second direction, the second data line includes a first portion extending in the first direction, and the first portion of the second data line is located between the first initialization signal line and the eighth connection electrode.

In some embodiments, the display panel includes a first display region and a second display region, the first display region is located on at least one side of the second display region, the pixel unit includes a first pixel unit and a second pixel unit, both the pixel circuit and the light-emitting element of the first pixel unit are located in the first display region, the pixel circuit of the second pixel unit is located in the first display region, and the light-emitting element of the second pixel unit is located in the second display region, the pixel circuit of the second pixel unit is connected to the light-emitting element of the second pixel unit through a conductive line.

In some embodiments, an orthographic projection of the conductive line on the base substrate partially overlaps with an orthographic projection of the pixel circuit of the first pixel unit on the base substrate.

In some embodiments, an orthographic projection of at least one selected from the group consisting of the tenth via hole, the ninth via hole, the seventh via hole, and the sixth via hole on the base substrate does not overlap with an orthographic projection of the conductive line on the base substrate.

At least one embodiment of the present disclosure further provides a display device including any one of the display panels as described above.

For example, the display device further includes a sensor, the sensor is located on one side of a display panel.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure and thus are not construed as any limitation to the present disclosure.

DETAILED DESCRIPTION

In order to make objectives, technical details, and advantages of the embodiments of the present disclosure more clear, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. Also, the phrases "connect", "connected", etc., are not intended to define a physical connection or mechanical connection, but may include an electrical connection, directly or indirectly. "On," "under," "right," "left" and the like are only used to indicate relative position relationship, and when the position of the described object is changed, the relative position relationship may be changed accordingly.

Figure 1A:
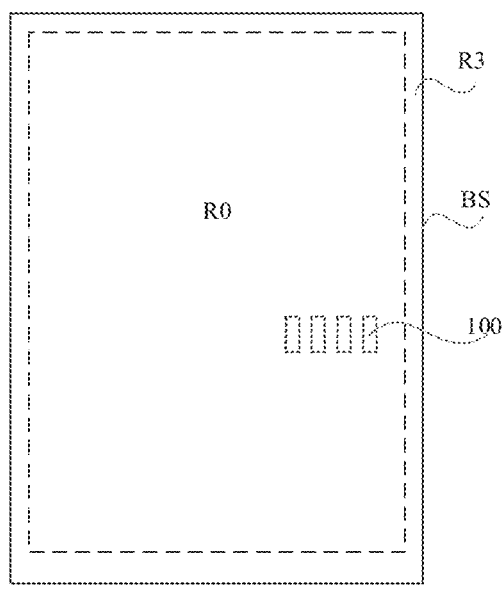
FIG. 1A is a schematic diagram of a display panel.

FIG. 1A is a schematic diagram of a display panel. As illustrated in FIG. 1A, the display panel may include: a base substrate BS. The display panel includes a display region R0 and a peripheral region R3. The peripheral region R3 may be located on at least one side of the display region R0. FIG. 1A is described with reference to the case where the peripheral region R3 surrounds the display region R0, by way of example. For example, the display panel includes a plurality of pixel units 100, and the plurality of pixel units 100 are located in the display region R0. The plurality of pixel units 100 may be disposed in the display region R0 according to a certain rule. FIG. 1A only exemplarily illustrates four pixel units 100. The number of the pixel units 100 is not limited to that illustrated in the FIG. 1A.

Figure 1B:
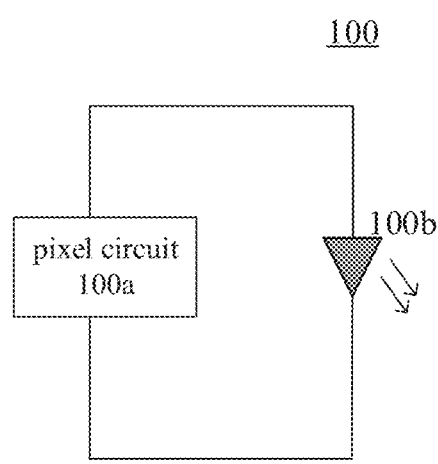
FIG. 1B is a schematic diagram of a pixel unit of a display panel.

FIG. 1B is a schematic diagram of a pixel unit of a display panel. As illustrated in FIG. 1B, the pixel unit 100 includes a pixel circuit 100a and a light-emitting element 100b, and the pixel circuit 100a is configured to drive the light-emitting element 100b. For example, the pixel circuit 100a is configured to provide a driving current to drive the light-emitting element 100b to emit light. For example, the light-emitting element 100b is an organic light-emitting diode (OLED), and the light-emitting element 100b emits red light, green light, blue light, or white light under a driving of its corresponding pixel circuit 100a. A light-emitting color of the light-emitting element 100b can be determined according to needs.

Figure 1C:
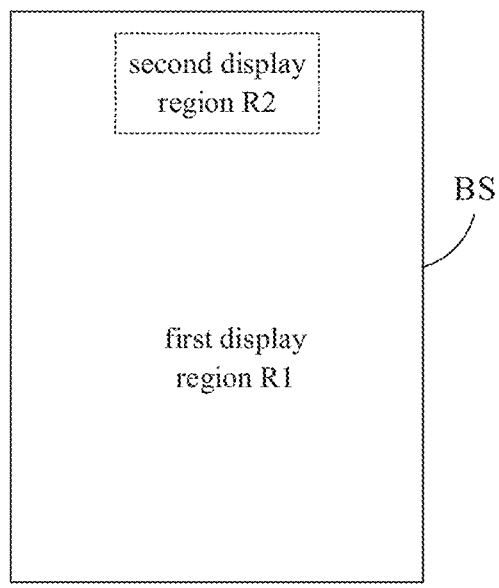
FIG. 1C is a schematic structural diagram of the display panel provided by an embodiment of the present disclosure.

FIG. 1C is a schematic structural diagram of the display panel provided by an embodiment of the present disclosure. As illustrated in FIG. 1C, the display panel may include: a base substrate BS. The display panel includes a first display region R1 and a second display region R2, the first display region R1 may be located on at least one side of the second display region R2. For example, in some embodiments, the first display region R1 surrounds the second display region R2. That is, the second display region R2 may be surrounded by the first display region R1. The second display region R2 can also be disposed at other positions, and an arrangement position of the second display region R2 can be determined according to needs. For example, the second display region R2 may be deposed at a top middle position of the base substrate BS, or may be deposed at an upper left position or an upper right position of the base substrate BS. For example, a hardware such as a photosensitive sensor (for example, a camera) is disposed in the second display region R2. For example, the second display region R2 is a light transmission display region, and the first display region R1 is a display region. For example, the first display region R1 is opaque and only used for display.

In order to increase a light transmittance of the second display region R2, only light-emitting elements may be disposed in the second display region R2, and pixel circuits for driving the light-emitting elements of the second display region R2 may be disposed in the first display region R1. That is, the light transmittance of the second display region R2 is improved by a manner in which the light-emitting elements and the pixel circuits are separately disposed.

Figure 1D:
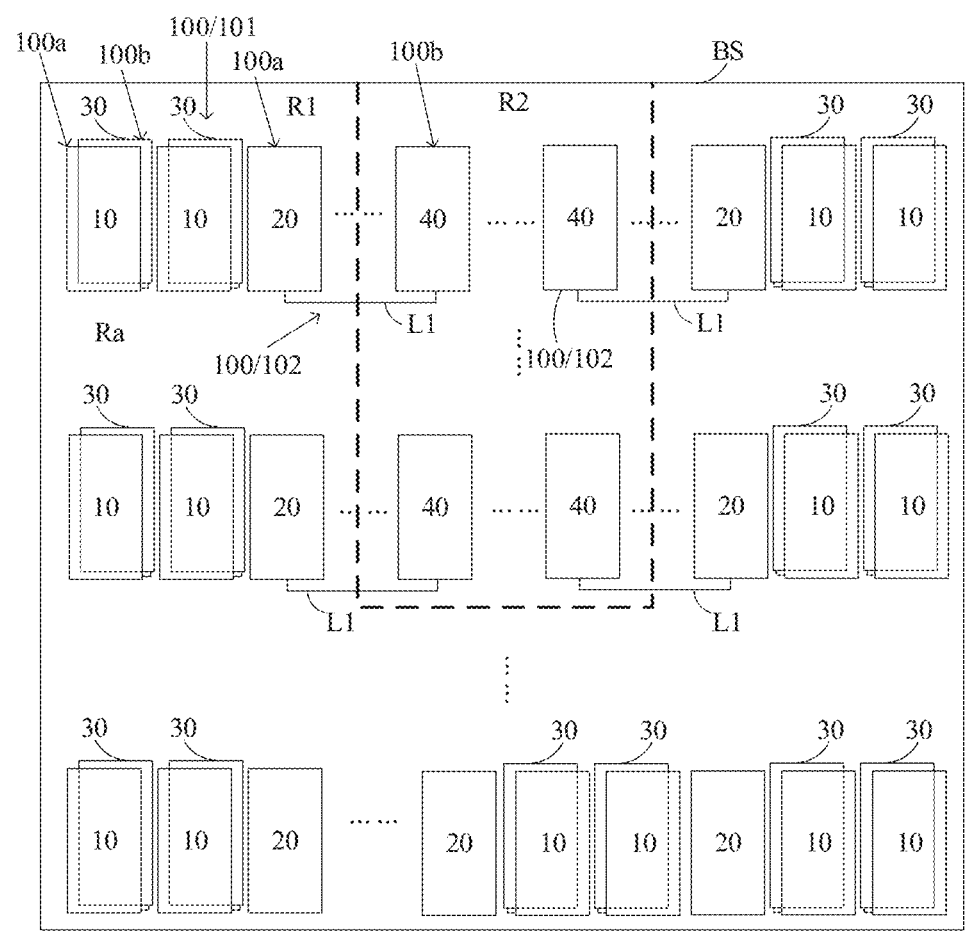
FIG. 1D is a schematic diagram of the display panel provided by an embodiment of the present disclosure.

FIG. 1D is a schematic diagram of the display panel provided by an embodiment of the present disclosure. As illustrated in FIG. 1D, the display panel includes: a plurality of first pixel circuits 10, a plurality of second pixel circuits 20, and a plurality of first light-emitting elements 30 that are located in the first display region R1, and a plurality of second light-emitting elements 40 located in the second display region R2. For example, the plurality of second pixel circuits 20 may be distributed among the plurality of first pixel circuits 10 at intervals.

For example, as illustrated in FIG. 1D, at least one first pixel circuit 10 of the plurality of first pixel circuits 10 can be connected to at least one first light-emitting element 30 of the plurality of first light-emitting elements 30, and an orthographic projection of at least one first pixel circuit 10 on the base substrate BS can at least overlap with an orthographic projection of at least one first light-emitting element 30 on the base substrate BS. The at least one first pixel circuit 10 can be used to provide a driving signal for the first light-emitting element 30 connected thereto to drive the first light-emitting element 30 to emit light.

For example, as illustrated in FIG. 1D, at least one second pixel circuit 20 of the plurality of second pixel circuits 20 is connected to at least one second light-emitting element 40 of the plurality of second light-emitting elements 40 through a conductive line L1, and the at least one second pixel circuit 20 can be used to provide a driving signal for the second light-emitting element 40 connected thereto to drive the second light-emitting element 40 to emit light. As illustrated in FIG. 1D, because the second light-emitting element 40 and the second pixel circuit 20 are deposed in different regions, there is no overlap portion between an orthographic projection of the at least one second pixel circuit 20 on the base substrate BS and an orthographic projection of the at least one second light-emitting element 40 on the base substrate BS.

For example, in the embodiments of the present disclosure, the first display region R1 can be arranged as an opaque display region, and the second display region R2 can be arranged as a light transmission display region. For example, the first display region R1 cannot transmit light, and the second display region R2 can transmit light. In this way, the display panel provided by the embodiment of the present disclosure does not need to perform a drilling process on the display panel, and required hardware structure such as a photosensitive sensor can be directly deposed at a position corresponding to the second display region R2 on one side of the display panel, which lays a solid foundation for a realization of a true full screen. In addition, because the second display region R2 only includes the light-emitting elements and does not include any pixel circuits, it is conducive to increasing the light transmittance of the second display region R2, so that the display panel has a better display effect.

As illustrated in FIG. 1D, the pixel unit 100 includes a first pixel unit 101 and a second pixel unit 102, a pixel circuit 100a and a light-emitting element 100b of the first pixel unit 101 are both located in the first display region R1, and a pixel circuit 100a of the second pixel unit 102 is located in the first display region R1, and a light-emitting element 100b of the second pixel unit 102 is located in the second display region R2. In the embodiments of the present disclosure, the pixel circuit 100a of the first pixel unit 101 is the first pixel circuit 10, the light-emitting element 100b of the first pixel unit 101 is the first light-emitting element 30, the pixel circuit 100a of the second pixel unit 102 is the second pixel circuit 20, and the light-emitting element 100b of the second pixel unit 102 is the second light-emitting element 40. For example, the first pixel circuit 10 may be referred to as an in-situ pixel circuit, and the second pixel circuit 20 may be referred to as an ex-situ pixel circuit.

For example, as illustrated in FIG. 1D, the second light-emitting element 40 and the second pixel circuit 20 connected to the second light-emitting element 40 are located in the same row. That is, the light-emitting signal of the second light-emitting element 40 comes from the second pixel circuit in the same row. For example, pixel circuits of pixel units in the same row are connected to the same gate line.

As illustrated in FIG. 1D, the pixel circuit (the second pixel circuit 20) of the second pixel unit 102 is connected to the light-emitting element (the second light-emitting element 40) of the second pixel unit 102 through the conductive line L1. For example, the conductive line L1 is made of a transparent conductive material. For example, the conductive line L1 is made of conductive oxide material. For example, the conductive oxide material includes indium tin oxide (ITO), but is not limited thereto.

As illustrated in FIG. 1D, one end of the conductive line L1 is connected to the second pixel circuit 20, and the other end of the conductive line L1 is connected to the second light-emitting element 40. As illustrated in FIG. 1D, the conductive line L1 extends from the first display region R1 to the second display region R2.

Figure 1E:
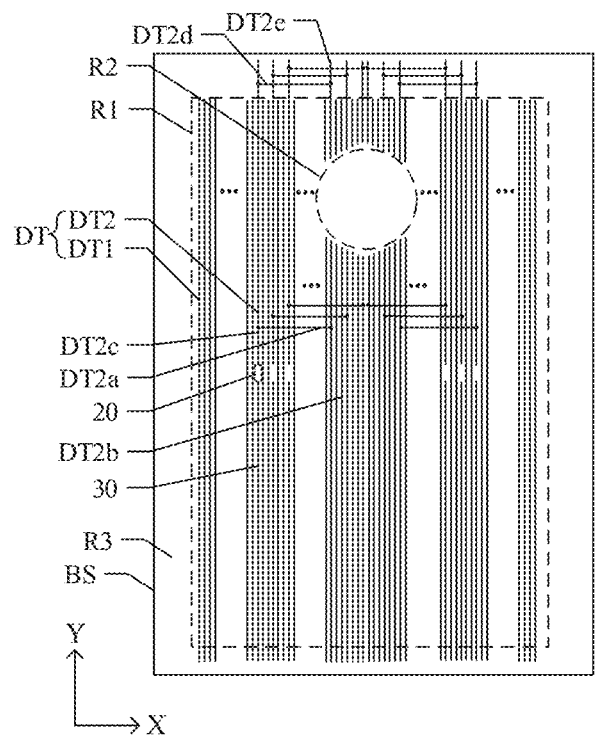
FIG. 1E is a schematic diagram of a display panel.

FIG. 1E is a schematic diagram of a display panel. As illustrated in FIG. 1E, the display panel includes a plurality of data lines DT located on the base substrate BS. In the display device with the under-screen camera, the plurality of data lines are arranged in two ways: winding in the second display region R2 and winding outside the second display region, due to a limitation of a space of the second display region, the display panel illustrated in FIG. 1E is designed according to a fully compressed pixel circuit scheme, and the data lines are disposed in a way of winding outside the second display region R2. In the display panel, the first display region R1 includes a plurality of first pixel circuit columns and a plurality of second pixel circuit columns, and the second pixel circuit column where the second pixel circuits are located not only includes the second pixel circuits, but also includes a dummy pixel circuit not connected to any light-emitting element; the first display region R1 further includes a plurality of dummy pixel circuit columns, and at least one first pixel circuit column is disposed between two dummy pixel circuit columns. The fully compressed pixel circuit mentioned above refers to compressing a plurality of pixel circuit columns in an overall display region in a first direction X (for example, reducing a size of each pixel circuit in the first direction X) without reducing a pixel density of the overall display region (including the first display region and the second display region) to increase a number of pixel circuits arranged in the first direction X, a newly added pixel circuit column includes a second pixel circuit column for connecting with the second light-emitting element of the second display region, and the dummy pixel circuit column not connected to any light-emitting element.

As illustrated in FIG. 1E, the plurality of data lines DT includes a data line DT1 and a data line DT2, the data line DT1 is only connected to the first pixel circuit, and the data line DT2 is at least connected to the second pixel circuit. The data line DT1 is a data line extending in a second direction Y. The data line DT2 includes a first portion DT2a, a second portion DT2b, a third portion DT2c, a fourth portion DT2d, and a fifth portion DT2e. For example, as illustrated in FIG. 1E, the second portion DT2b, the first portion DT2a, the third portion DT2c, the fourth portion DT2d, and the fifth portion DT2e are connected in sequence to form the second data line DT2. A space 20 is provided between the third portion DT2c and a dummy line 30 to achieve insulation between the third portion DT2c and the dummy line 30. The dummy line 30 is connected to the dummy pixel circuit. In order to avoid floating of the dummy line 30, the dummy line 30 may be connected to a signal line having a fixed voltage, for example, a power supply voltage signal (VDD). For example, each data line DT can be driven by a single channel. It should be noted that the arrangement of the plurality of data lines DT is not limited to that illustrated in FIG. 1E. FIG. 1E is described by taking that the fourth portion DT2d is located in the peripheral region R3 as an example. In other embodiments, the fourth portion DT2d is located in the first display region R1.

Of course, in the display panel that does not adopt a full compression method, the second data line DT2 may not be provided. The embodiments of the present disclosure are described with reference to the case where a display panel adopts the full compression method as an example.

During a process of forming the conductive line L1, the conductive line may be broken or thinned, which may cause display defect of dark spots. Possible reasons for the display defect of dark spots will be described below with reference to FIG. 1F to FIG. 1H.

Figure 1F:
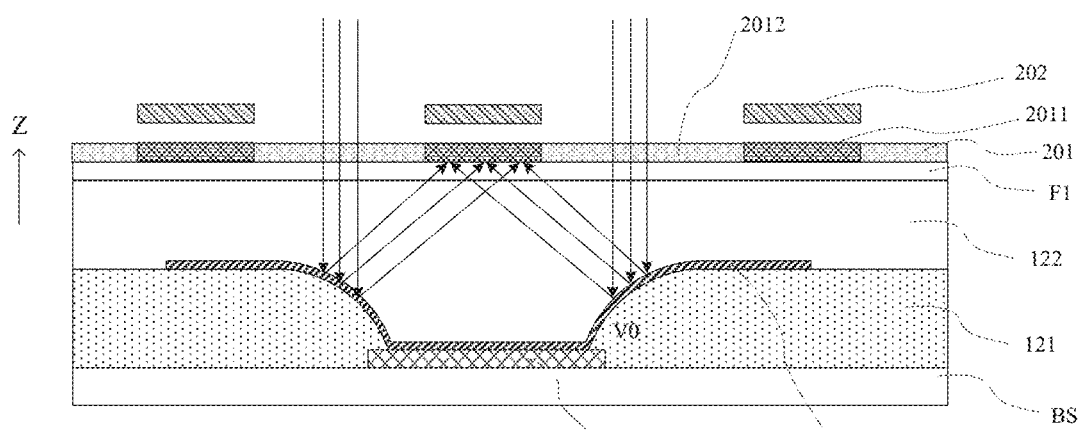
FIG. 1F is a cross-sectional view of a display panel.
Figure 1G:
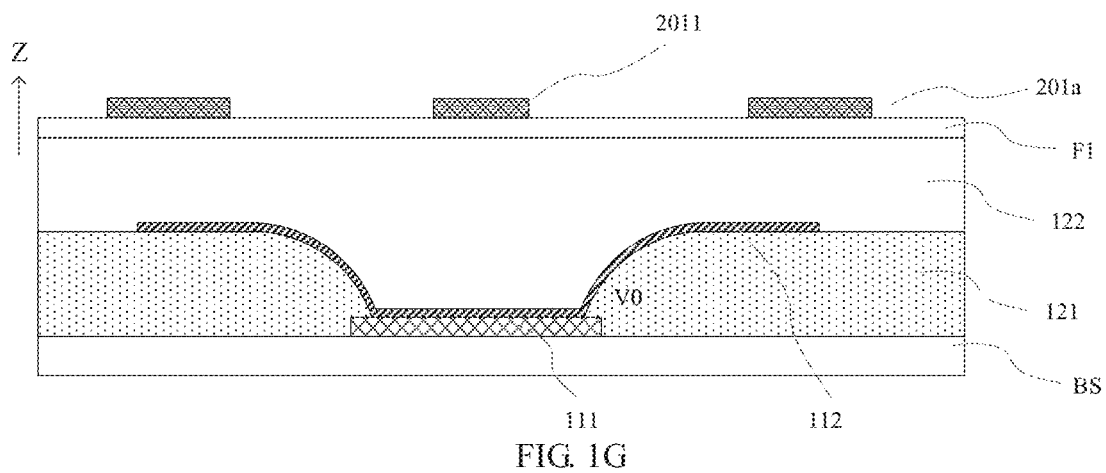
FIG. 1G is a schematic diagram of forming a photoresist pattern.
Figure 1H:
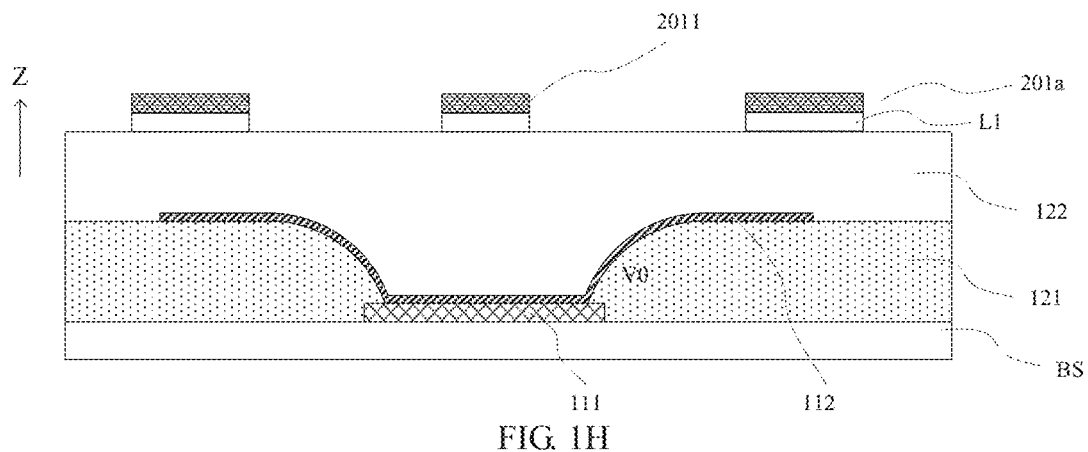
FIG. 1H is a schematic diagram of forming a conductive line.

FIG. 1F is a cross-sectional view of a display panel. FIG. 1F is a schematic diagram of an exposure process when patterning a transparent conductive film in the process of forming the conductive line L1. FIG. 1G is a schematic diagram of forming a photoresist pattern. FIG. 1H is a schematic diagram of forming a conductive line. As illustrated in FIG. 1F, a first conductive element 111 is located on the base substrate BS; a first planarization layer 121 is located on the first conductive element 111; a second conductive element 112 is located on the first planarization layer 121 and is connected to the first conductive element 111 through a via hole V0 penetrating the first planarization layer 121; a second planarization layer 122 is located on the second conductive element 112. As illustrated in FIG. 1F, forming the conductive line L1 includes forming a transparent conductive film F1 on the second planarization layer 122, forming a photoresist film 201 on the transparent conductive film F1, and using a mask 202 as a mask to expose the photoresist film 201, so that the photoresist film 201 forms a photoresist retaining portion 2011 and a photoresist to-be-removed portion 2012. As illustrated in FIG. 1G, a development process is performed after the exposure process. In the development process, the photoresist to-be-removed portion 2012 is removed to form a photoresist pattern 201a. As illustrated in FIG. 1H, the transparent conductive film F1 is etched by using the photoresist pattern 201a as a mask to form the conductive line L1. For example, the conductive line L1 includes a plurality of conductive lines L1, and the plurality of conductive lines L1 including a plurality of first conductive lines located in a first transparent conductive layer and a plurality of second conductive lines located in a second transparent conductive layer. An insulating layer may be provided between the first transparent conductive layer and the second transparent conductive layer. In other embodiments, three or more transparent conductive layers may be disposed to provide more conductive lines. An insulating layer is disposed between adjacent transparent conductive layers.

After the exposure process, the photoresist on the transparent conductive film is exposed to be broken and thinned, which leads to broken or thinning of the conductive line after developing and etching, resulting in display defect of dark spots. Optical microscope confirms that the position where the conductive line is broken and thinned is the position where the conductive line crosses the via hole V0 of the first planarization layer 121, and further by performing a focused ion beam (FIB) analysis on the cross section of the via hole V0 of the first planarization layer 121, it is found that a bowl-shaped portion of the second conductive element 112 is below the position where the conductive line, passing across the via hole V0, is broken or thinned. Therefore, as illustrated in FIG. 1F, the reason for determining that the conductive line is broken or thinned is that: in the exposure process, the second conductive element 112 reflects light and condenses the light to the photoresist retaining portion 2011 of the photoresist above the bowl-shaped portion (the position corresponding to the via hole V0) of the second conductive element 112, so that this portion of the photoresist is exposed or partially exposed, and washed away after development, so that the conductive line formed after a process of etching the transparent conductive film using the photoresist pattern 201a as a mask is broken and thinned. As illustrated in FIG. 1F to FIG. 1H, the photoresist retaining portion 2011 of the photoresist located in the middle position is irradiated by the partially reflected light, so that the conductive line below the photoresist is thinned.

Figure 2:
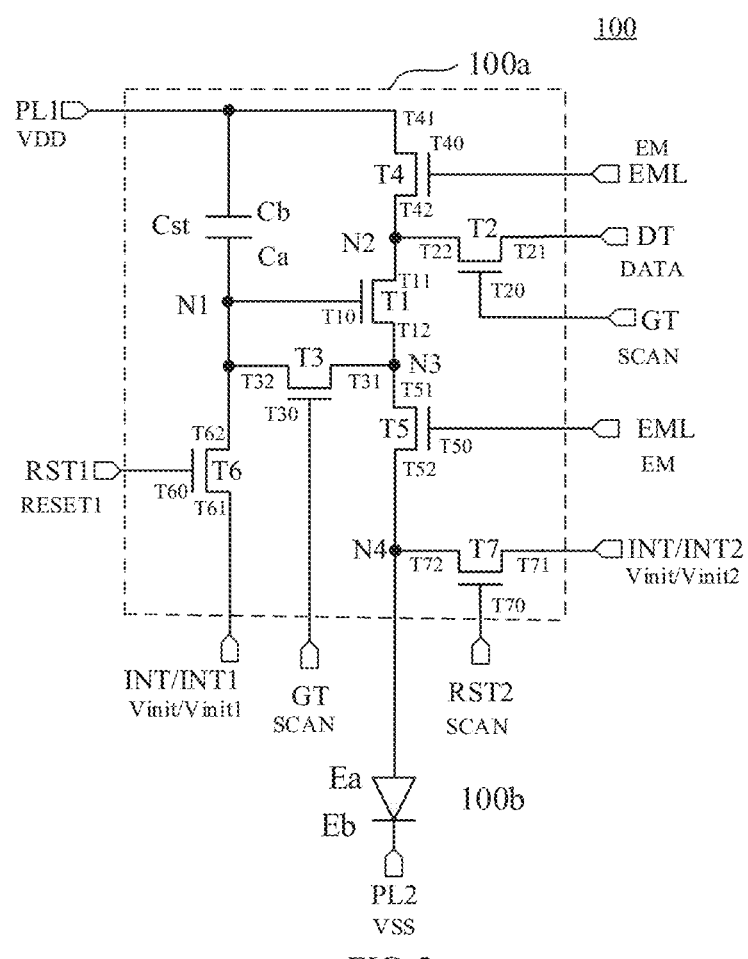
FIG. 2 is a schematic diagram of the pixel circuit in the display panel provided by an embodiment of the present disclosure.
Figure 3:
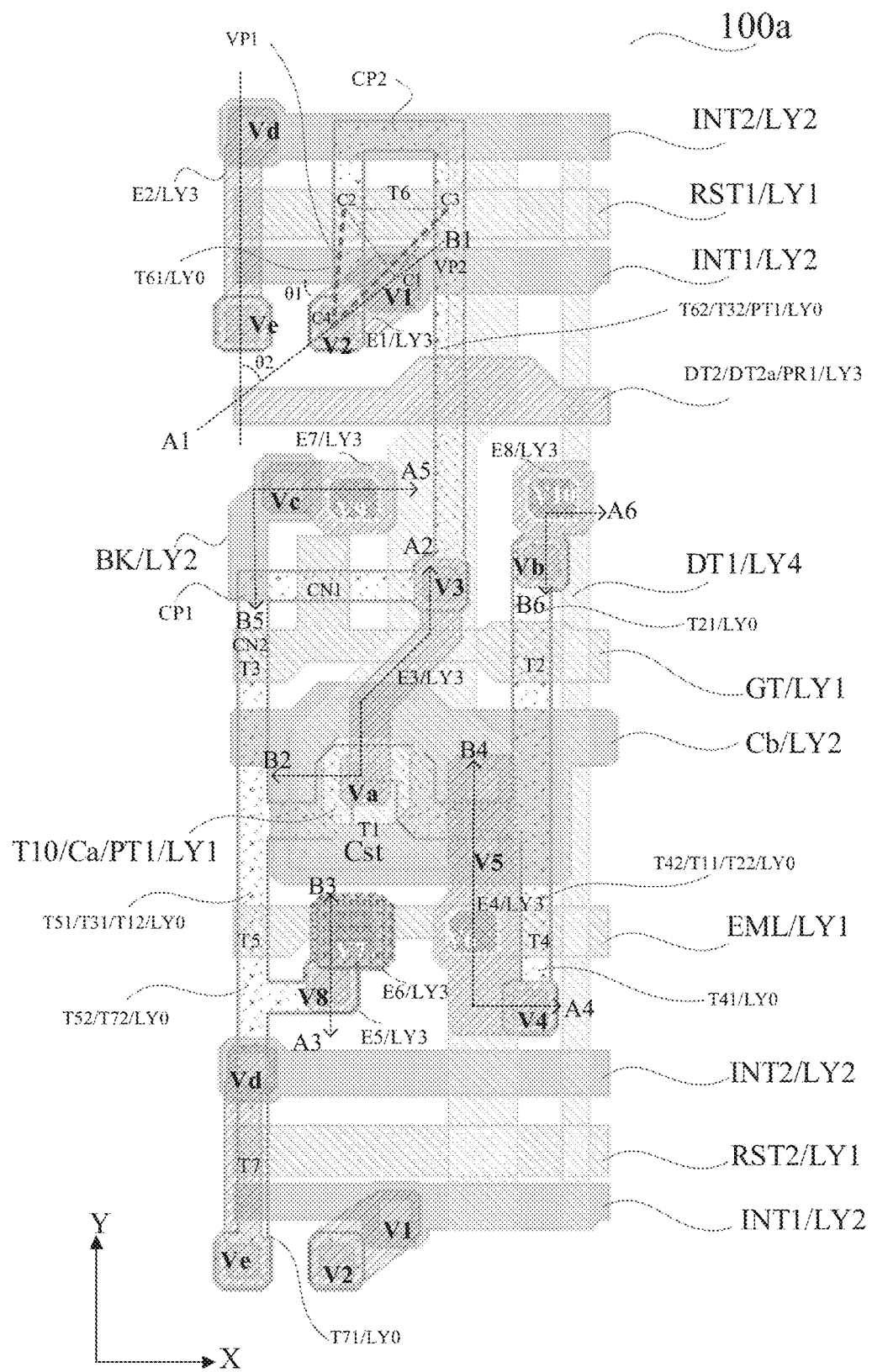
FIG. 3 is a layout diagram of the pixel circuit in the display panel provided by an embodiment of the present disclosure.
Figure 4A:
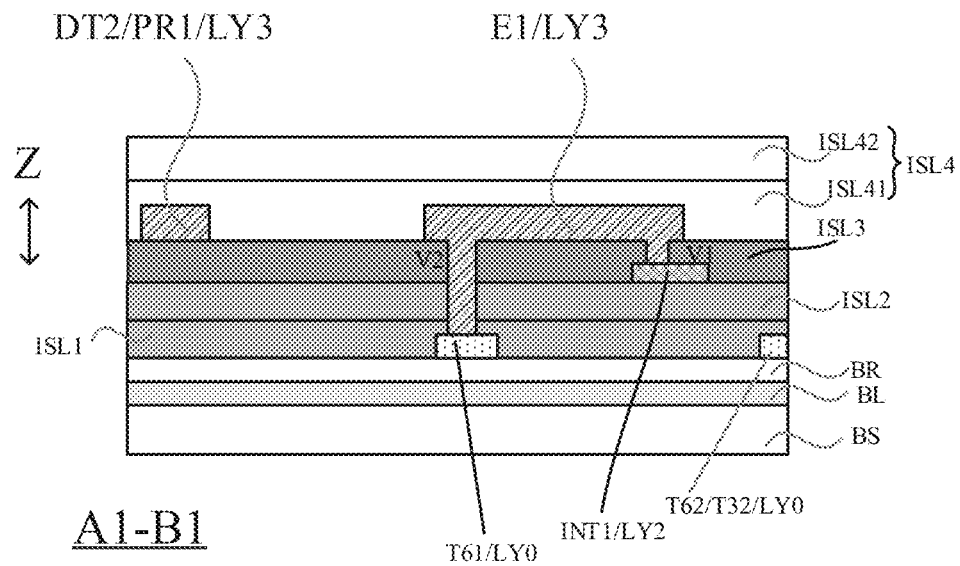
FIG. 4A is a cross-sectional view taken along line A1-B1 of FIG. 3.
Figure 4B:
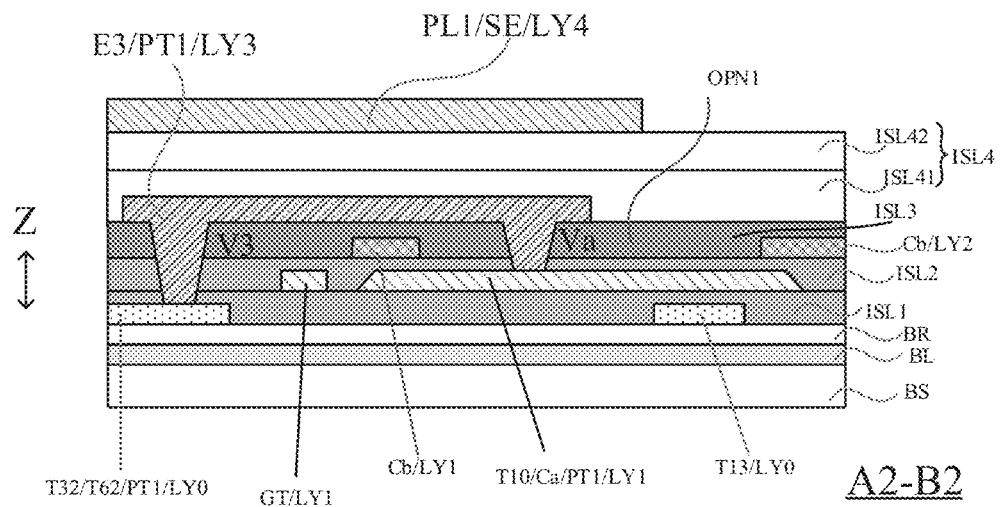
FIG. 4B is a cross-sectional view taken along line A2-B2 of FIG. 3.
Figure 4C:
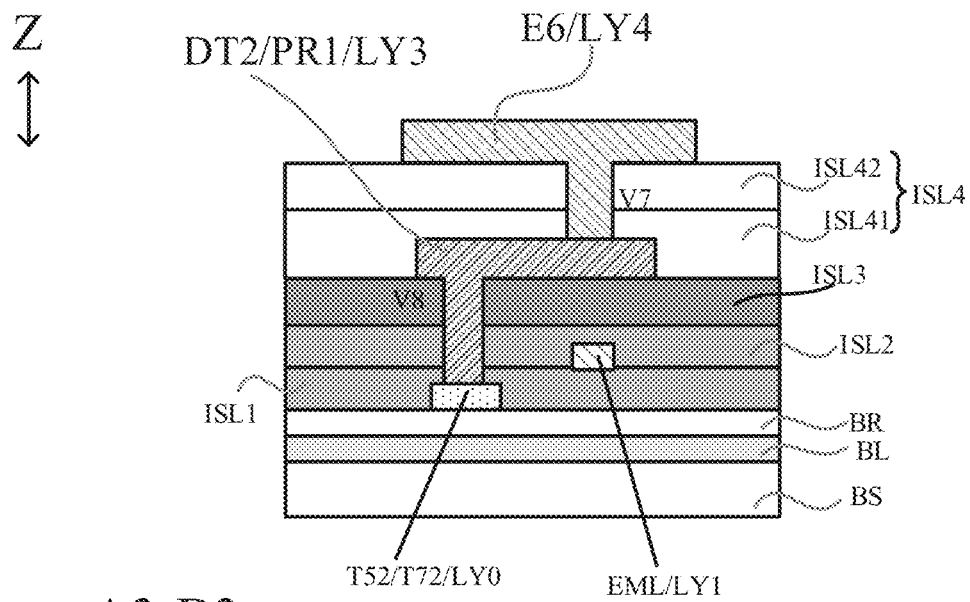
FIG. 4C is a cross-sectional view taken along line A3-B3 of FIG. 3.
Figure 4D:
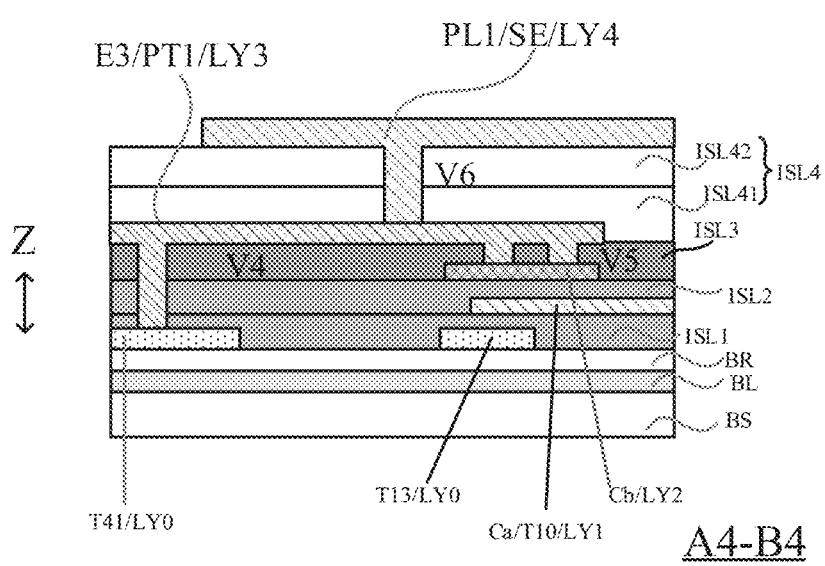
FIG. 4D is a cross-sectional view taken along line A4-B4 of FIG. 3.
Figure 4E:
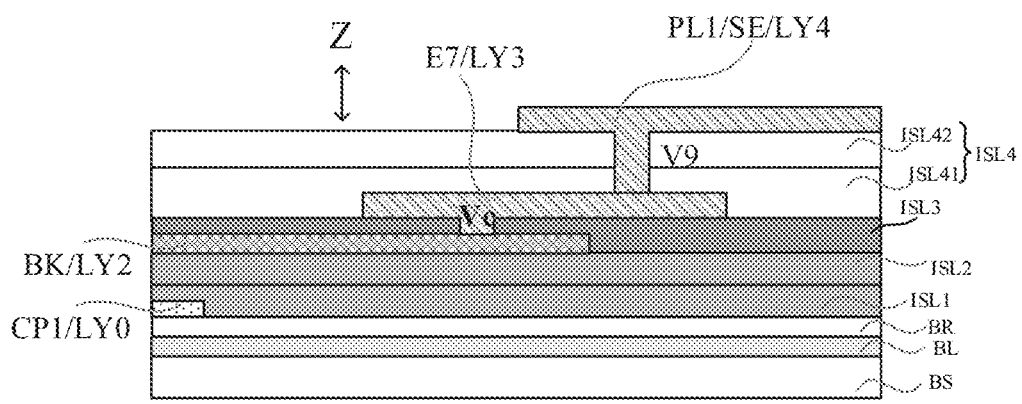
FIG. 4E is a cross-sectional view taken along line A5-B5 of FIG. 3.
Figure 4F:
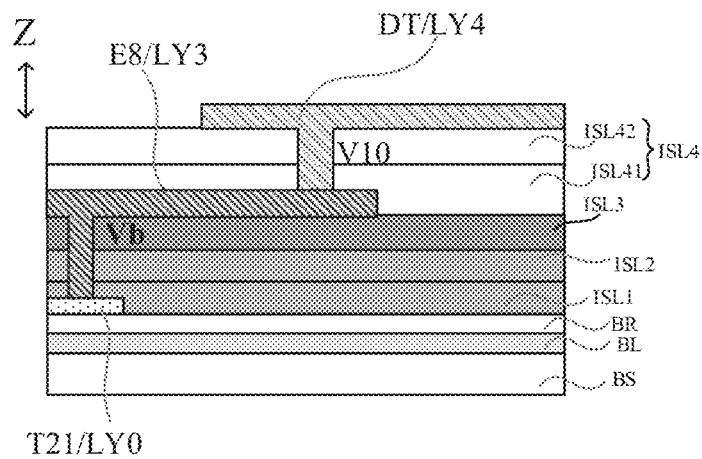
FIG. 4F is a cross-sectional view taken along line A6-B6 of FIG. 3.

FIG. 2 is a schematic diagram of the pixel circuit in the display panel provided by an embodiment of the present disclosure. FIG. 3 is a layout diagram of the pixel circuit in the display panel provided by an embodiment of the present disclosure. FIG. 4A is a cross-sectional view taken along line A1-B1 of FIG. 3. FIG. 4B is a cross-sectional view taken along line A2-B2 of FIG. 3. FIG. 4C is a cross-sectional view taken along line A3-B3 of FIG. 3. FIG. 4D is a cross-sectional view taken along line A4-B4 of FIG. 3. FIG. 4E is a cross-sectional view taken along line A5-B5 of FIG. 3. FIG. 4F is a cross-sectional view taken along line A6-B6 of FIG. 3. FIG. 5 to FIG. 16 are plan views of a single-layer structure or a multi-layer structure in the display panel illustrated in FIG. 3. The display panel provided by some embodiments of the present disclosure will be described below with reference to FIG. 1A to FIG. 16.

The pixel circuit illustrated in FIG. 2 may be a common low temperature poly-silicon (LTPS) AMOLED pixel circuit in the related art. FIG. 2 illustrates a pixel circuit of one pixel unit of the display panel. As illustrated in FIG. 2, the pixel unit 100 includes a pixel circuit 100a and a light-emitting element 100b. The pixel circuit 100a includes six switching transistors (T2-T7), one driving transistor T1, and one storage capacitor Cst. The six switching transistors are a data writing transistor T2, a threshold compensation transistor T3, a first light-emitting control transistor T4, a second light-emitting control transistor T5, a first reset transistor T6, and a second reset transistor T7, respectively. The light-emitting element 100b includes a first electrode Ea, a second electrode Eb, and a light-emitting functional layer deposited between the first electrode Ea and the second electrode Eb. It should be noted that, FIG. 2 to FIG. 16 take a pixel circuit of 7T1C as an example for description, and embodiments of the present disclosure include but are not limited to this. In some embodiments, the pixel circuit 100a may not include at least one of the six switching transistors.

In some embodiments of the present disclosure, as illustrated in FIG. 2, the first electrode Ea is an anode, and the second electrode Eb is a cathode. Generally, the threshold compensation transistor T3 and the first reset transistor T6 adopt a dual-gate thin film transistors (TFT) to reduce leakage current.

In some embodiments of the present disclosure, referring to FIG. 1A, FIG. 1B, FIG. 2, FIG. 3, FIG. 9, FIG. 15 and FIG. 16, the display panel provided by some embodiments of the present disclosure include: a base substrate BS, a pixel unit 100, a first initialization signal line INT1, and a connection electrode E1.

In some embodiments of the present disclosure, referring to FIG. 1A, FIG. 1B, FIG. 2, and FIG. 3, the pixel unit 100 is located on the base substrate BS, includes the pixel circuit 100a and the light-emitting element 100b, and the pixel circuit 100a is configured to drive the light-emitting element 100b, the pixel circuit 100a includes a driving transistor T1 and a first reset transistor T6, the first reset transistor T6 is connected to the driving transistor T1, and is configured to reset a gate electrode of the driving transistor T1.

In some embodiments of the present disclosure, referring to FIG. 2 and FIG. 3, the first initialization signal line INT1 is connected to a first electrode T61 of the first reset transistor T6 and is configured to provide a first initialization signal Vinit1 to the pixel unit 100.

In some embodiments of the present disclosure, referring to FIG. 2, the first initialization signal line INT1 is connected to the first electrode T61 of the first reset transistor T6 through the connection electrode E1. Referring to FIG. 2 and FIG. 3, the connection electrode E1 is connected to the first initialization signal line INT1 through a via hole V1, and is connected to the first electrode of the first reset transistor T6 through a via hole V2, and the first initialization signal line INT1 extends in the first direction X, and the connection electrode E1 is inclined with respect to the first initialization signal line INT1.

In the display panel provided by some embodiments of the present disclosure, the connection electrode E1 is inclined with respect to the first initialization signal line INT1, so as to reduce the size of the pixel circuit in the first direction X, for example, to reduce a horizontal size of the pixel circuit. In the case where the data lines in the display panel are disposed in a winding manner, the connection electrode E1 is inclined with respect to the first initialization signal line INT1 to provide the space for arranging the first portion DT2a of the second data line DT2.

In some embodiments of the present disclosure, that the connection electrode E1 is inclined with respect to the first initialization signal line INT1 includes that the connection electrode E1 and the first initialization signal line INT1 are not parallel with each other and are not perpendicular to each other.

Figure 15:
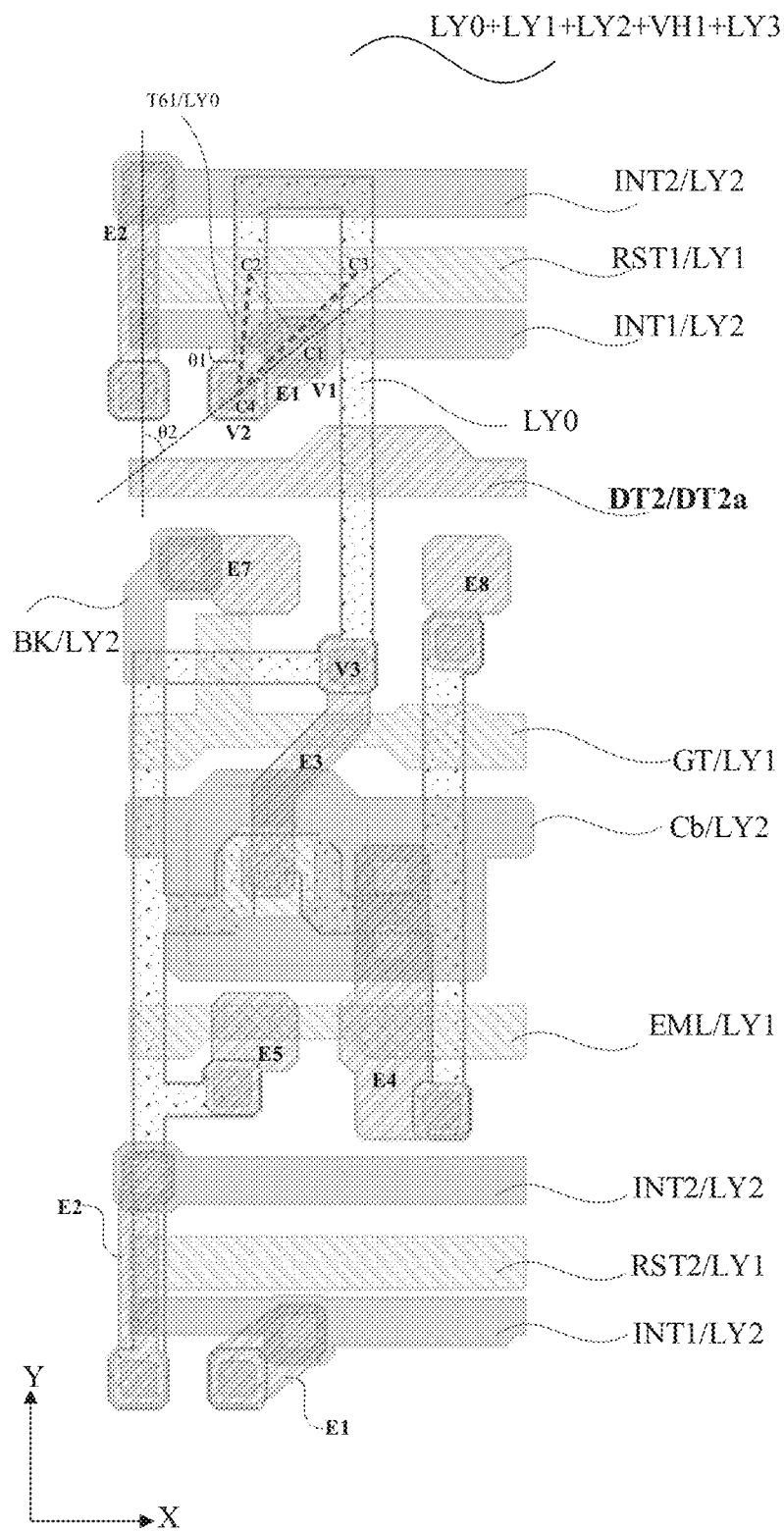
Figure 16:
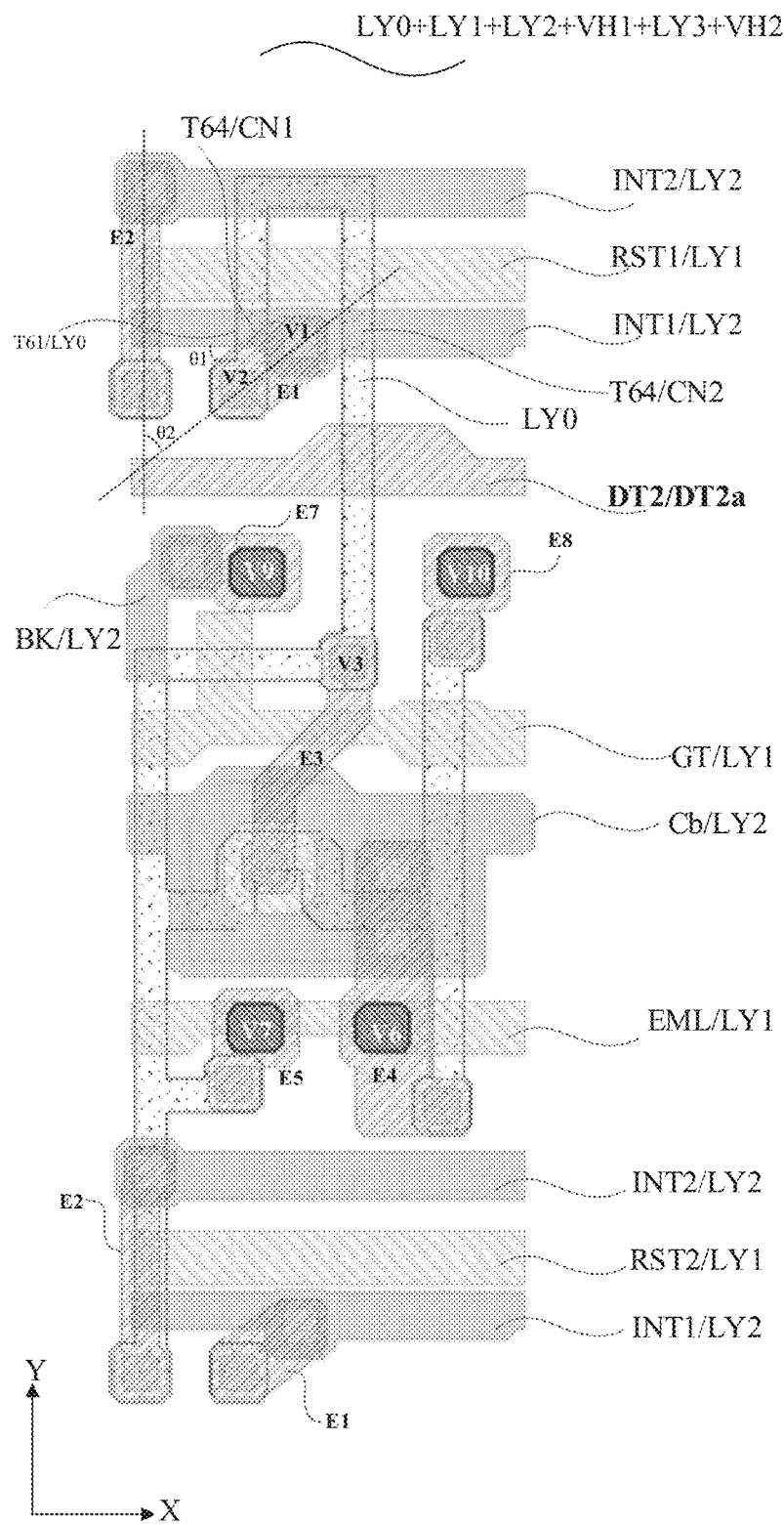

In some embodiments of the present disclosure, as illustrated in FIG. 3, FIG. 15 and FIG. 16, an included angle $\theta 1$ between an extension direction of the connection electrode E1 and an extension direction of the first initialization signal line INT1 is an acute angle.

In some embodiments of the present disclosure, as illustrated in FIG. 3, FIG. 15 and FIG. 16, in order to facilitate layout design, the included angle $\theta 1$ is greater than or equal to 30 degrees and less than or equal to 60 degrees.

Figure 12:
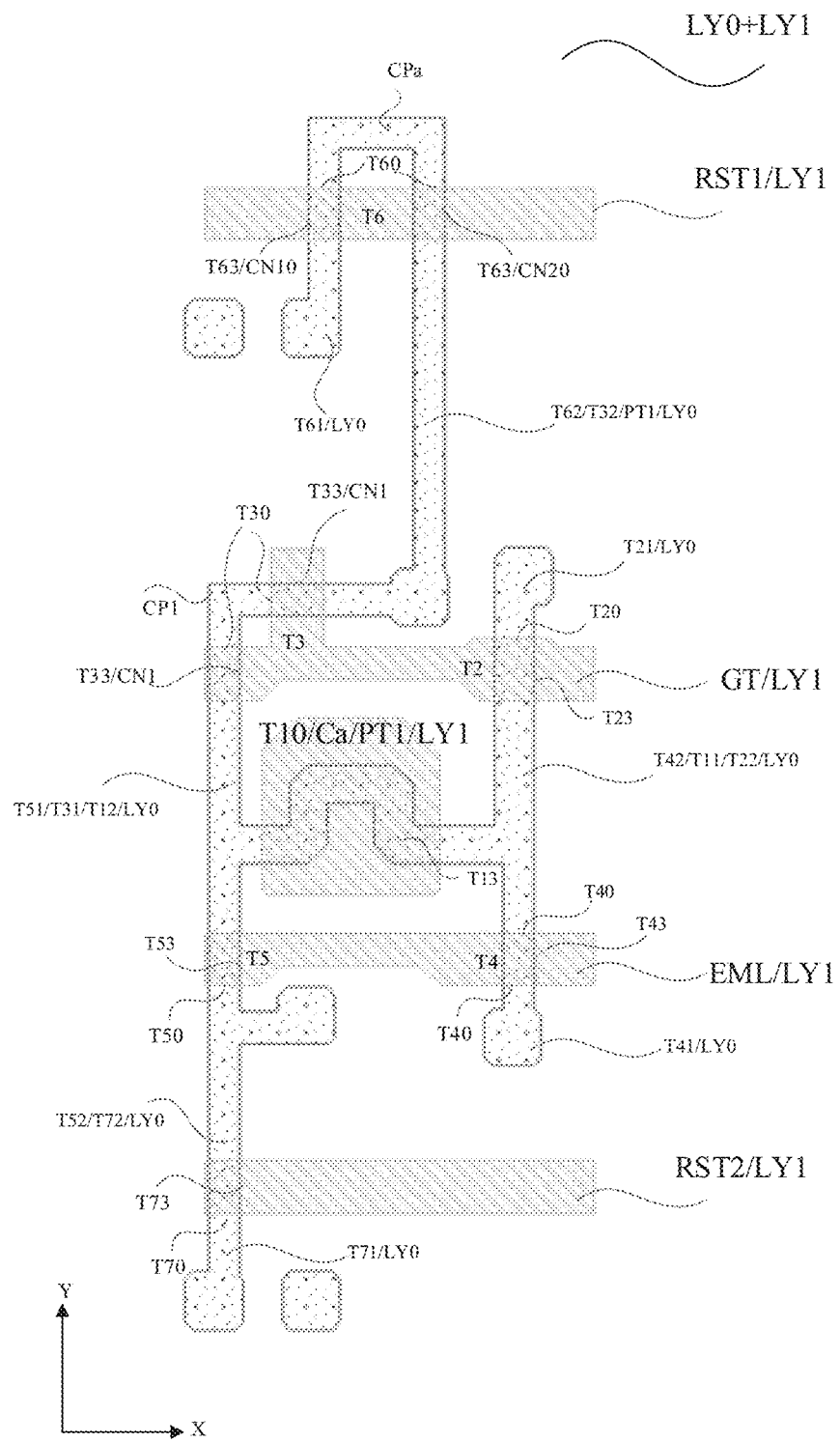

In some embodiments of the present disclosure, as illustrated in FIG. 3 and FIG. 12, the first reset transistor T6 includes a channel CN1 and a channel CN2. For example, as illustrated in FIG. 3 and FIG. 15, lines connecting centers of the via hole V1, the channel CN1 and the channel CN2 form an acute triangle, and lines connecting centers of the via hole V2, the channel CN1 and the channel CN2 form an obtuse triangle. For example, the acute triangle is an isosceles triangle, but not limited thereto. FIG. 3 and FIG. 15 illustrate a center C1 of the via hole V1, a center C4 of the via hole V2, a center C2 of the channel CN1 of the first reset transistor T6, and a center C3 of the channel CN2 of the first reset transistor T6. For example, in embodiments of the present disclosure, a center of an element refers to a center of a geometry shape of the element.

Figure 13:
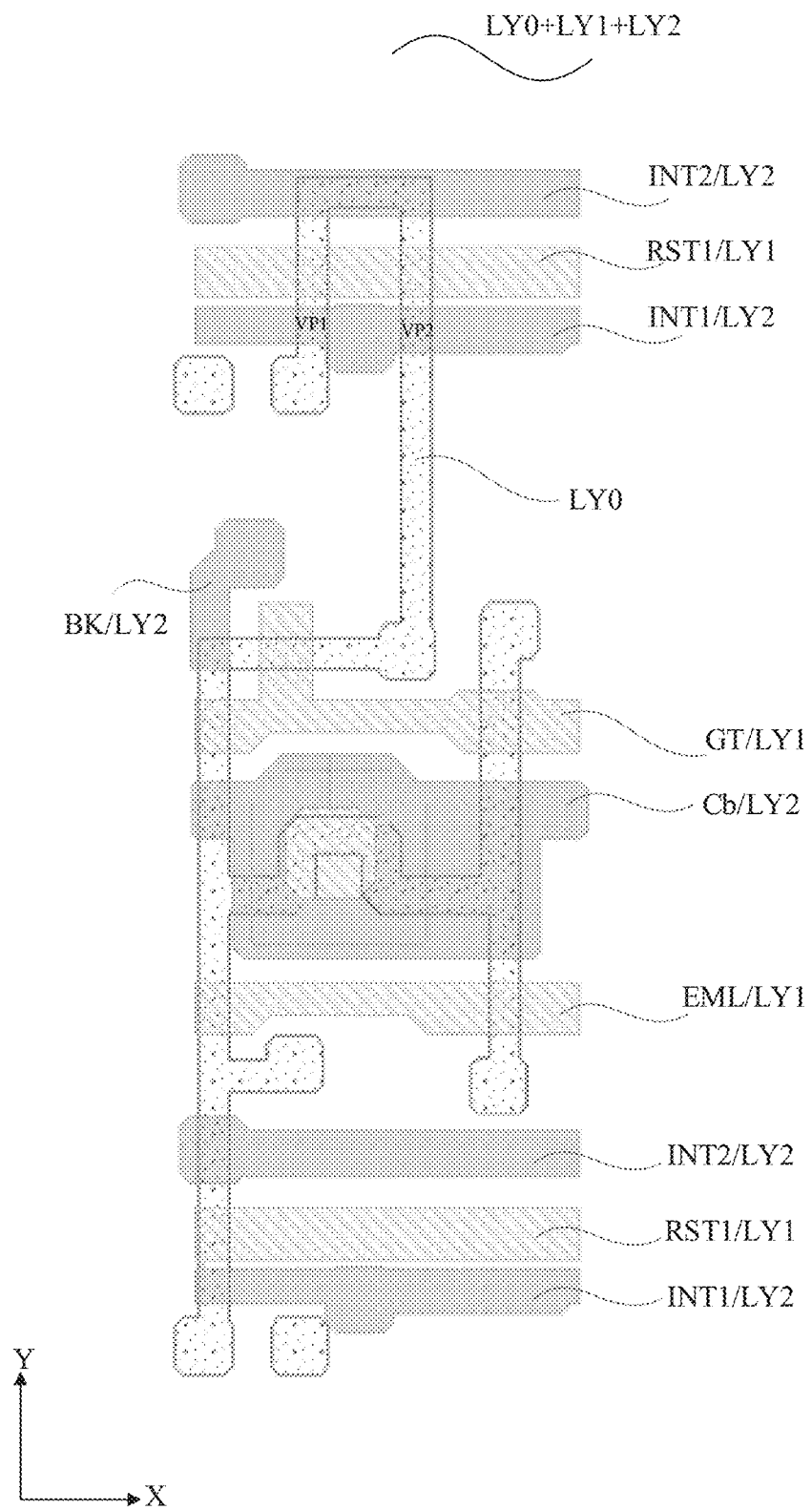
Figure 14:
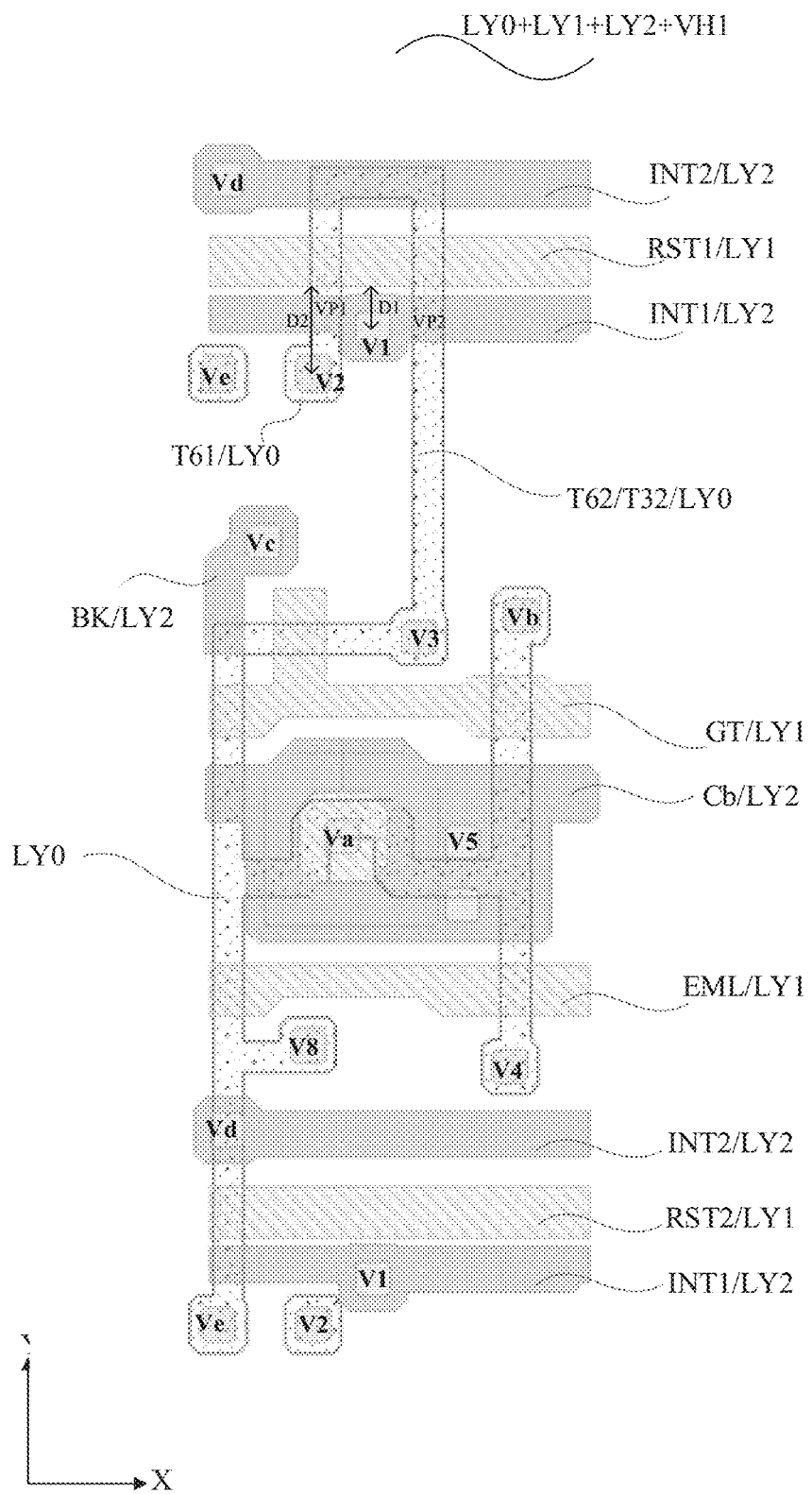

In some embodiments of the present disclosure, as illustrated in FIG. 3, FIG. 13 and FIG. 14, in order to facilitate reducing the size of the pixel circuit in the first direction, the first initialization signal line INT1 includes a first overlap portion VP1 overlapping with the first electrode T61 of the first reset transistor T6 and a second overlap portion VP2 overlapping with the second electrode of the first reset transistor T6. As illustrated in FIG. 3 and FIG. 14, in a plan view, the via hole V1 is located between the first overlap portion VP1 and the second overlap portion VP2. As illustrated in FIG. 3 and FIG. 14, an orthographic projection of the via hole V1 on the base substrate is located between an orthographic projection of the first overlap portion VP1 on the base substrate and an orthographic projection of the second overlap portion VP2 on the base substrate.

In some embodiments of the present disclosure, as illustrated in FIG. 3 and FIG. 14, in order to avoid affecting the first electrode T61 and the second electrode T62 of the first reset transistor T6 during the process of forming the via hole V1, the orthographic projection of the via hole V1 on the base substrate BS does not overlap with the orthographic projection of the first electrode T61 of the first reset transistor T6 on the base substrate BS, and does not overlap with the orthographic projection of the second electrode T62 of the first reset transistor T6 on the base substrate BS.

In some embodiments of the present disclosure, as illustrated in FIG. 2, FIG. 3, FIG. 13 and FIG. 14, the display panel further includes a first reset control signal line RST1 and a second initialization signal line INT2, and the first reset control signal line RST1 is configured to provide a first reset control signal RESET1 to the pixel unit 100, the second initialization signal line INT2 is configured to provide a second initialization signal Vinit2 to the pixel unit 100, the pixel circuit 100a further includes a second reset transistor T7, a first electrode T71 of the second reset transistor T7 is connected to the second initialization signal line INT2, and a second electrode T72 of the second reset transistor T7 is connected to the first electrode Ea of the light-emitting element 100b, and is configured to reset the first electrode Ea of the light-emitting element 100b, the first reset control signal line RST1 is connected to a gate electrode T60 of the first reset transistor T6, the first initialization signal line INT1 and the second initialization signal line INT2 are located in the same layer which is different from the layer where the first reset control signal line RST1 is located in, an orthographic projection of the first reset control signal line RST1 on the base substrate BS is located between an orthographic projection of the first initialization signal line INT1 on the base substrate BS and an orthographic projection of the second initialization signal line INT2 on the base substrate BS. That is, the first initialization signal line INT1 and the second initialization signal line INT2 are disposed on opposite sides of the first reset control signal line RST1, respectively.

In some embodiments of the present disclosure, as illustrated in FIG. 3, FIG. 6, FIG. 13 and FIG. 14, the first reset control signal line RST1 is located in a first conductive layer LY1. As illustrated in FIG. 3, FIG. 13 and FIG. 14, both the first initialization signal line INT1 and the second initialization signal line INT2 are located in a second conductive layer LY2.

In the display panel provided by some embodiments of the present disclosure, the first initialization signal line INT1 and the second initialization signal line INT2 are located in the same layer, and are located in a different layer where the first reset control signal line RST1 is located, an orthographic projection of the first reset control signal line RST1 on the base substrate BS is located between an orthographic projection of the first initialization signal line INT1 on the base substrate BS and an orthographic projection of the second initialization signal line INT2 on the base substrate BS, so that the first reset control signal line RST1 can be disposed in a space between the first initialization signal line INT1 and the second initialization signal line INT2, thereby reducing a vertical space occupied by the first initialization signal line INT1, the second initialization signal line INT2, and the first reset control signal line RST1, which is conducive to saving the vertical space. In the case where the display panel includes the data line winding outside the second display region, an arrangement space is provided for a portion of the data line extending in the first direction X (the first portion DT2a of the second data line DT2). In the case where the first initialization signal line INT1 and the second initialization signal line INT2 are located on the same side of the first reset control signal line RST1, due to a relatively large spacing between the first initialization signal line INT1 and the second initialization signal line INT2 located on the same layer, the vertical space occupied by the first initialization signal line INT1, the second initialization signal line INT2, and the first reset control signal line RST1 is relatively large.

In some embodiments of the present disclosure, as illustrated in FIG. 3, FIG. 15 and FIG. 16, the via hole V1 and the via hole V2 are located on the same side of the first reset control signal line RST1.

In some embodiments of the present disclosure, as illustrated in FIG. 3, FIG. 14, FIG. 15 and FIG. 16, a distance D1 from the via hole V1 to the first reset control signal line RST1 is smaller than a distance D2 from the via hole V2 to the first reset control signal line RST1. FIG. 4B illustrates the distance D1 from the via hole V1 to the first reset control signal line RST1, and the distance D2 from the via hole V2 to the first reset control signal line RST1. For example, the distance D1 from the via hole V1 to the first reset control signal line RST1 may refer to a minimum distance from the center of the via hole V1 to an edge of the first reset control signal line RST1. For example, the distance D2 from the via hole V2 to the first reset control signal line RST1 may refer to a minimum distance from the center of the via hole V2 to an edge of the first reset control signal line RST1.

Figure 6:
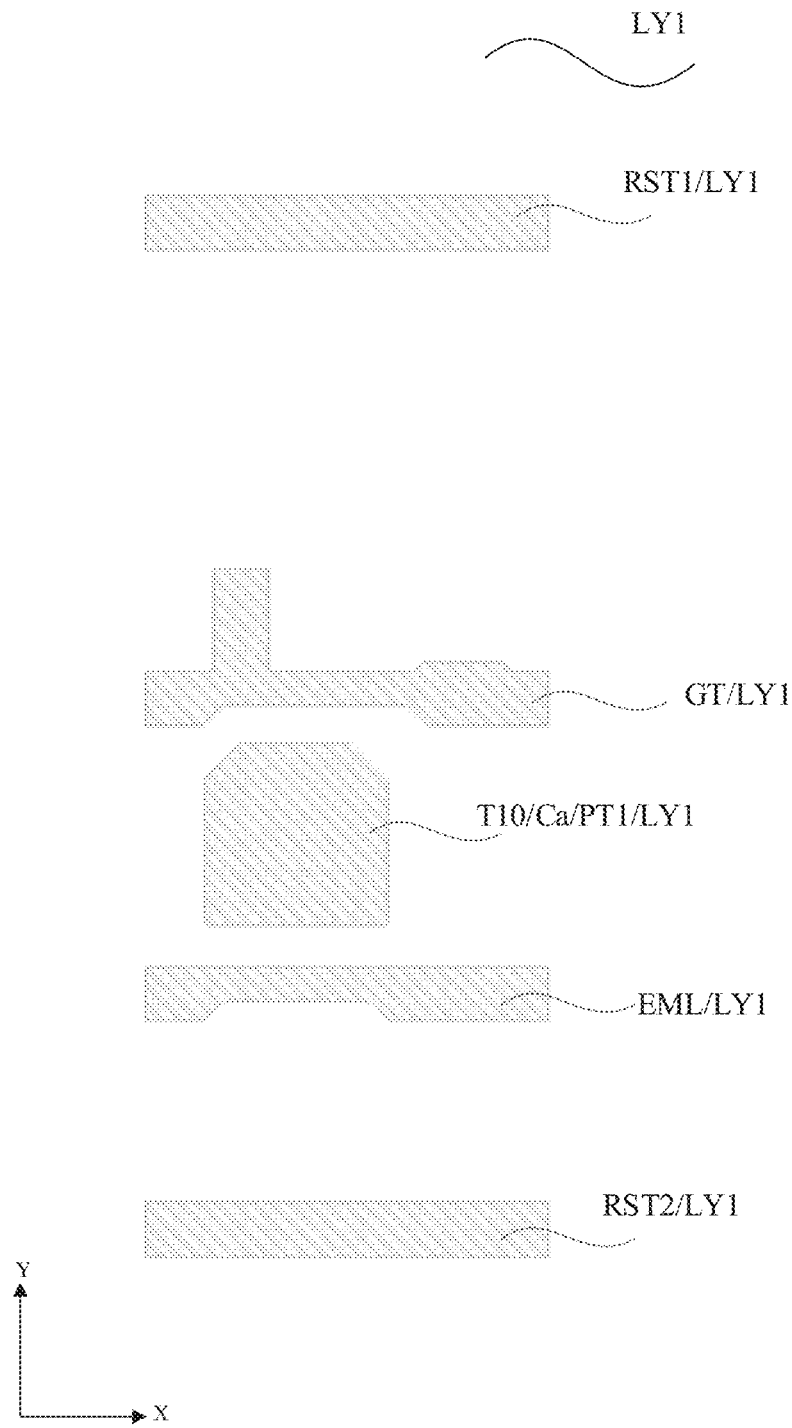
Figure 7:
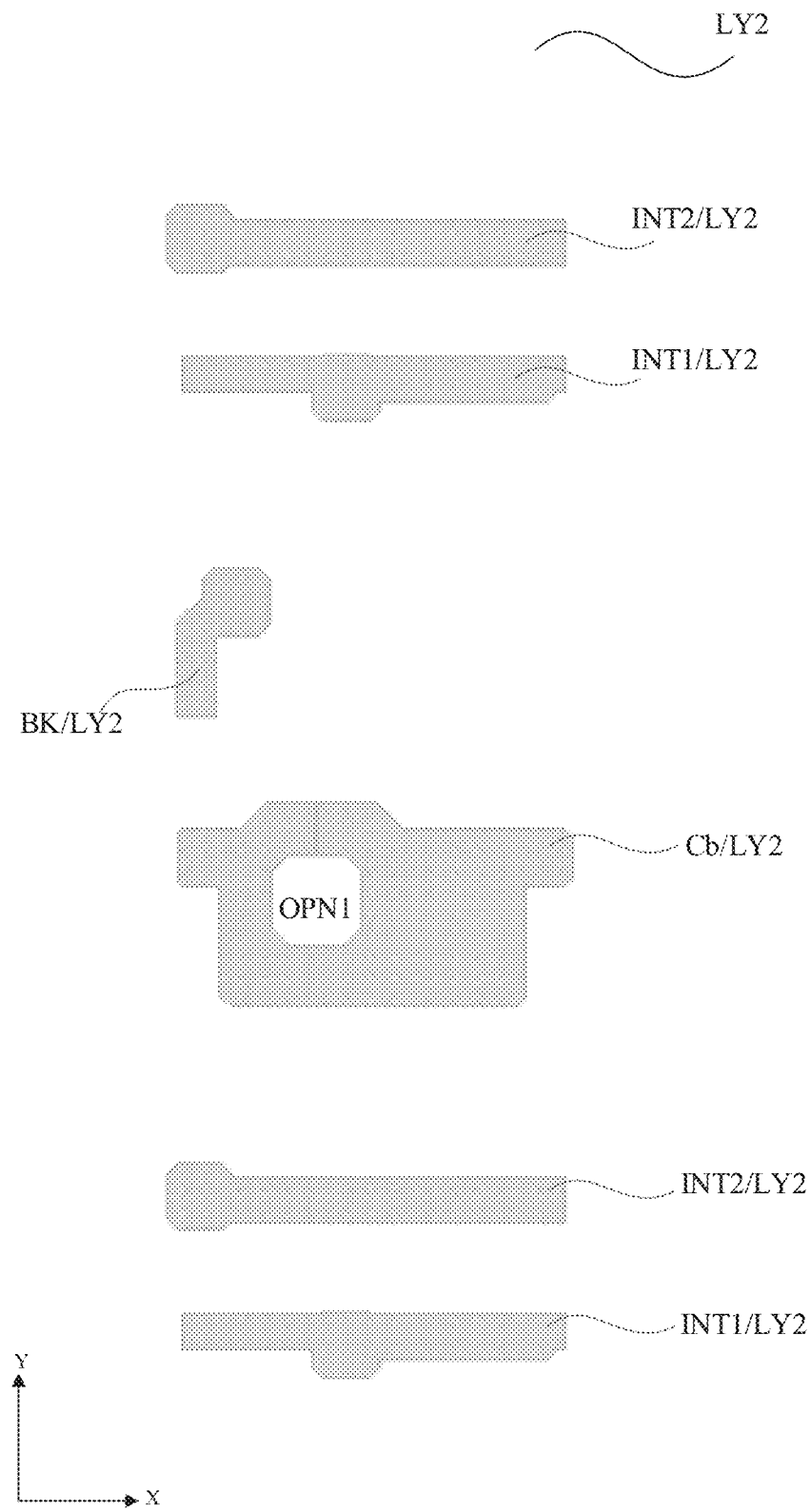
Figure 8:
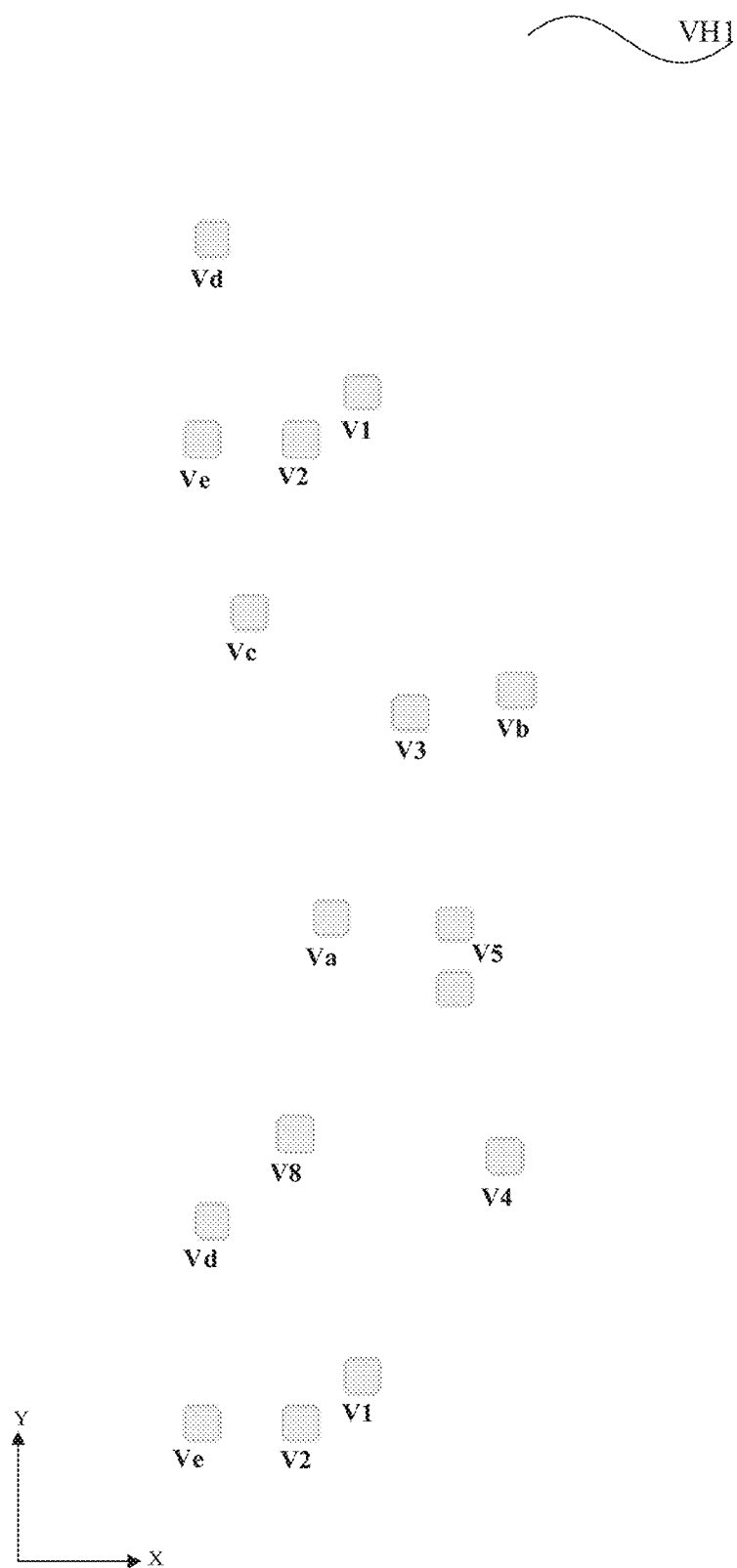
Figure 9:
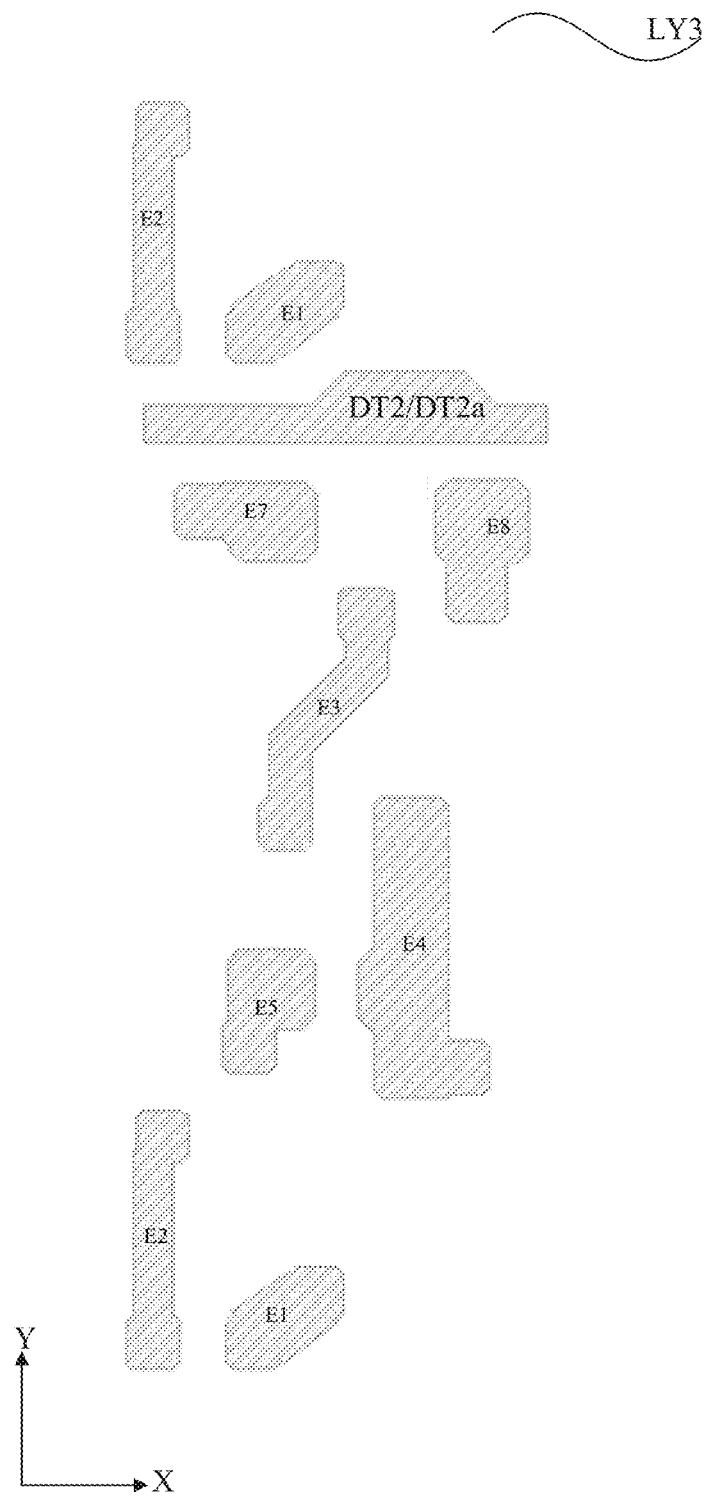
Figure 10:
Figure 10:
Figure 10:
Figure 10:
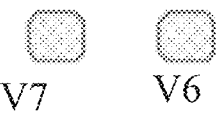
Figure 10:
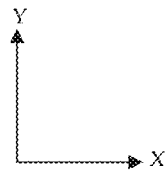
Figure 11:
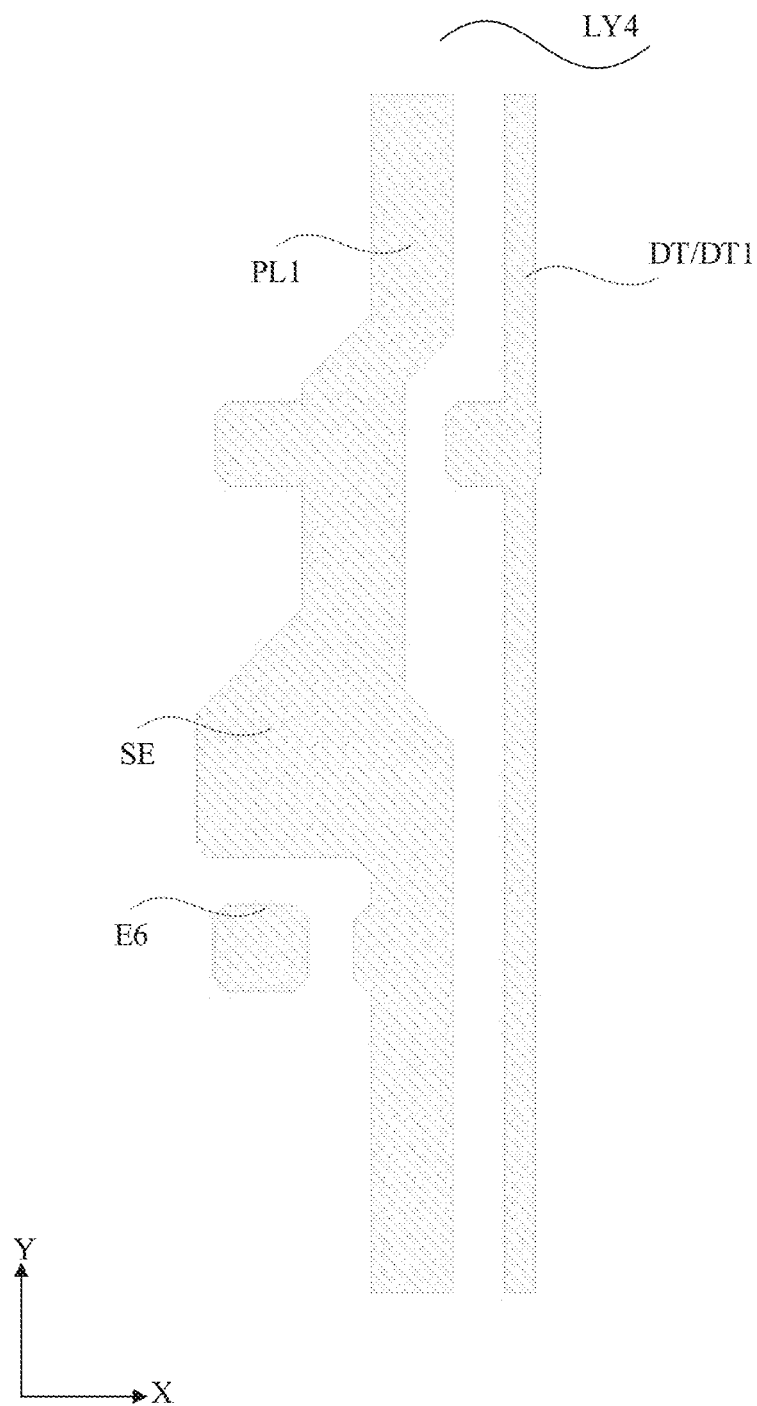

In some embodiments of the present disclosure, as illustrated in FIG. 3 and FIG. 6, the first reset control signal line RST1 is located in the first conductive layer LY1. For example, as illustrated in FIG. 3 and FIG. 6, a gate electrode T10 of the driving transistor is located in the first conductive layer LY1. For example, as illustrated in FIG. 7, the first initialization signal line INT1 and the second initialization signal line INT2 are located in the second conductive layer LY2. For example, as illustrated in FIG. 9, the connection electrode E1 is located in a third conductive layer LY3. As illustrated in FIG. 4B, the first conductive layer LY1 is closer to the base substrate BS than the second conductive layer LY2, and the second conductive layer LY2 is closer to the base substrate BS than the third conductive layer LY3. FIG. 7 illustrates that a second electrode Cb of the storage capacitor Cst includes an opening OPN1, and the arrangement of opening OPN1 can achieve a connection between the connection electrode E3 and a first electrode Ca of the storage capacitor Cst.

In some embodiments of the present disclosure, as illustrated in FIG. 4B, the display panel includes a first insulating layer ISL1, a second insulating layer ISL2, a third insulating layer ISL3, and a fourth insulating layer ISL4. FIG. 4B is described with reference to the case where the fourth insulating layer ISL4 includes an insulating sub-layer ISL41 and an insulating sub-layer ISL42 as an example. In some embodiments of the present disclosure, the insulating sub-layer ISL41 is a passivation layer, and the insulating sub-layer ISL42 is a first planarization layer.

In some embodiments of the present disclosure, as illustrated in FIG. 3, FIG. 15 and FIG. 16, the display panel further includes a connection electrode E2, and the second initialization signal line INT2 is connected to the first electrode T71 of the second reset transistor T7 through the connection electrode E2. That is, the connection electrode E2 is connected to the second initialization signal line INT2 and the first electrode T71 of the second reset transistor T7, respectively.

In some embodiments of the present disclosure, as illustrated in FIG. 3, FIG. 15 and FIG. 16, the connection electrode E1 is inclined with respect to the connection electrode E2.

In some embodiments of the present disclosure, an included angle θ2 between the extension direction of the connection electrode E1 and the extension direction of the connection electrode E2 is an acute angle. For example, the included angle θ2 between the extension direction of the connection electrode E1 and the extension direction of the connection electrode E2 is greater than or equal to 30 degrees and less than or equal to 60 degrees.

In some embodiments of the present disclosure, a sum of the included angle θ1 and the included angle θ2 is 90 degrees.

In some embodiments of the present disclosure, the first initialization signal line INT1 extends in the first direction X, the connection electrode E2 extends in the second direction Y, the connection electrode E1 is inclined with respect to the first direction X, and is inclined with respect to the second direction Y, and the first direction X is perpendicular to the second direction Y.

In some embodiments of the present disclosure, as illustrated in FIG. 3, FIG. 15 and FIG. 16, the via hole V1 and the connection electrode E2 are disposed on opposite sides of the first electrode T61 of the first reset transistor T6, respectively.

In some embodiments of the present disclosure, as illustrated in FIG. 3, FIG. 9, FIG. 11, FIG. 15 and FIG. 16, the display panel further includes a connection electrode E3, a first power supply line PL1, and a shield electrode SE, and the gate electrode T10 of the driving transistor T1 is connected to the second electrode T62 of the first reset transistor T6 through the connection electrode E3. The first power supply line PL1 is configured to provide a constant first voltage signal to the pixel unit 100, and the shield electrode SE and the first power supply line PL1 are of an integral structure, an orthographic projection of the shield electrode SE on the base substrate BS covers an orthographic projection of the connection electrode E3 on the base substrate BS. For example, the shield electrode SE and the first power supply line PL1 are both located in the same layer, that is, in a fourth conductive layer LY4. The shield electrode SE and the first power supply line PL1 are of an integral structure, so as to avoid connection through a via hole, and to avoid an influence on the conductive line caused by the via hole penetrating the fourth insulating layer.

For example, the gate electrode T10 of the driving transistor T1, the connection electrode E3, and the second electrode T62 of the first reset transistor T6 constitute a gate signal portion PT1. An electrical potential on the gate signal portion PT1 is the same.

In order to stabilize the electrical potential on the gate signal portion PT1, the display panel provided by the embodiments of the present disclosure is provided with a shield electrode SE. The shield electrode SE is connected to the first power supply line PL1, so that a voltage on the shield electrode SE is stable and plays a shielding role to prevent other signal lines from affecting the electrical potential on the gate signal portion PT1. For example, the shield electrode SE is provided to avoid the influence on a first node N1 caused by the conductive line L1 and to avoid affecting the electrical potential on the gate signal portion PT1. An orthographic projection of the connection electrode E3 on the base substrate BS falls within an orthographic projection of the shield electrode SE on the base substrate BS.

In some embodiments of the present disclosure, as illustrated in FIG. 3, FIG. 15 and FIG. 16, the connection electrode E3 is connected to the second electrode of the first reset transistor T6 through a via hole V3. As illustrated in FIG. 3, in order to stabilize the electrical potential on the gate signal portion PT1, an orthographic projection of the shield electrode SE on the base substrate BS covers an orthographic projection of the via hole V3 on the base substrate BS.

In some embodiments of the present disclosure, as illustrated in FIG. 3, in order to stabilize the electrical potential on the gate signal portion PT1, an orthographic projection of the shield electrode SE on the base substrate BS at least partially overlaps an orthographic projection of the second electrode of the first reset transistor T6 on the base substrate BS.

In some embodiments of the present disclosure, as illustrated in FIG. 2 and FIG. 3, the display panel further includes a connection electrode E4, the pixel circuit 100a further includes a first light-emitting control transistor T4 and a storage capacitor Cst, the first electrode Ca of the storage capacitor Cst is connected to the gate electrode T10 of the driving transistor T1, and the second electrode Cb of the storage capacitor Cst is connected to the first power supply line PL1 through the connection electrode E4. The connection electrode E4 is connected to the first electrode T41 of the first light-emitting control transistor T4 through a via hole V4, and the connection electrode E4 is connected to the second electrode Cb of the storage capacitor Cst through a via hole V5, and the first power supply line PL1 is connected to the connection electrode E4 through a via hole V6.

In some embodiments of the present disclosure, the first power supply line PL1 is connected to the second electrode Cb of the storage capacitor Cst and the first electrode T41 of the first light-emitting control transistor T4, respectively, through the connection electrode E4, which reduces the number of via holes penetrating the fourth insulating layer ISL4 and avoids thinning or broken of the conductive wire LL.

In some embodiments of the present disclosure, as illustrated in FIG. 3 and FIG. 16, the display panel further includes a connection electrode E5 and a connection electrode E6, and the pixel circuit 100a further includes a second light-emitting control transistor T5. A first electrode T51 of the second light-emitting control transistor T5 is connected to the driving transistor T1, the connection electrode E6 is connected to the connection electrode E5 through a via hole V7, the connection electrode E5 is connected to a second electrode T52 of the second light-emitting control transistor T5 through a via hole V8, and the via hole V7 and the via hole V6 are arranged in the first direction X.

In some embodiments of the present disclosure, as illustrated in FIG. 3 and FIG. 16, a distance from the via hole V7 to the first initialization signal line INT1 is equal to a distance from the via hole V6 to the first initialization signal line INT1. For example, the distance from the via hole V7 to the first initialization signal line INT1 may refer to the minimum distance from the center of the via hole V7 to the edge of the first initialization signal line INT1, and the distance from the via hole V6 to the first initialization signal line INT1 may refer to the minimum distance from the center of the via hole V6 to the edge of the first initialization signal line INT1.

In some embodiments of the present disclosure, as illustrated in FIG. 3, FIG. 4E, FIG. 7, FIG. 9, FIG. 11, FIG. 12, FIG. 15 and FIG. 16, the display panel further includes a block BK and a connection electrode E7, the pixel circuit 100a further includes a threshold compensation transistor T3, the threshold compensation transistor T3 includes a channel CN1, a channel CN2, and a conductive connection portion CP1 connecting the channel CN1 and the channel CN2. The connection electrode E7 is connected to the first power supply line PL1 through a via hole V9, the connection electrode E7 is connected to the block BK, an orthographic projection of the block BK on the base substrate BS at least partially overlaps with an orthographic projection of the conductive connection portion CP1 on the base substrate BS, and the block BK is configured to block the conductive connection portion CP1 of the pixel unit 100 where the block BK is located. Compared with that the block BK is used to block the conductive connection portion CP1 of the pixel unit on a left side or a right side of the pixel unit 100 where the block BK is located, the block BK is configured to block the conductive connection portion CP1 of the pixel unit 100 where the block BK is located makes the structure of the pixel units more compact, which is more conducive to the stability of the voltage on the conductive connection portion CP1. As illustrated in FIG. 3 and FIG. 4E, the connection electrode E7 is connected to the block BK through a via hole Vc. As illustrated in FIG. 4E, the via hole Vc penetrates the third insulating layer ISL3. As illustrated in FIG. 4E, the via hole V9 penetrates the fourth insulating layer ISL4.

In some embodiments of the present disclosure, as illustrated in FIG. 3, FIG. 12 to FIG. 16, the first reset transistor T3 includes a channel CN10, a channel CN20, and a conductive connection portion CPa connecting the channel CN10 and the channel CN20. As illustrated in FIG. 3, FIG. 13 to FIG. 16, in order to stabilize the voltage on the conductive connection portion CPa, the second initialization signal line INT2 overlaps with the conductive connection portion CPa. As illustrated in FIG. 3, FIG. 13 to FIG. 16, in order to stabilize the voltage on the conductive connection portion CPa, an orthographic projection of the second initialization signal line INT2 on the base substrate at least partially overlaps with an orthographic projection of the conductive connection portion CPa on the base substrate.

In some embodiments of the present disclosure, as illustrated in FIG. 3, FIG. 4F, FIG. 9, FIG. 11, FIG. 12, and FIG. 14 to FIG. 16, the display panel further includes a data line DT and a connection electrode E8, and the pixel circuit 100a further includes a data writing transistor T2, the data line DT is configured to provide data signals to the pixel unit 100, the data line DT is connected to the data writing transistor T2 through the connection electrode E8, and the connection electrode E8 is connected to the data line DT through a via hole V10. As illustrated in FIG. 3 and FIG. 16, the via hole V9 and the via hole V10 are arranged in the first direction X. The via hole V9 and the via hole V10 are both via holes penetrating the fourth insulating layer ISL4, the manner in which the via hole V9 and the via hole V10 are arranged in the first direction X is conducive to arranging the conductive line LL.

As illustrated in FIG. 3 and FIG. 4F, as illustrated in FIG. 3 and FIG. 16, the connection electrode E8 is connected to a first electrode T21 of the data writing transistor T2. As illustrated in FIG. 3 and FIG. 4F, the connection electrode E8 is connected to the first electrode T21 of the data writing transistor T2 through a via hole Vb. As illustrated in FIG. 4F, the via hole Vb penetrates the first insulating layer ISL1, the second insulating layer ISL2, and the third insulating layer ISL3.

In some embodiments of the present disclosure, in order to avoid thinning or broken of the conductive line L1, conductive lines may not be disposed at a lateral position where the via hole V9 and the via hole V10 are disposed, that is, the conductive line L1 is avoided to be disposed above the hole V9 and the via hole V10. In order to have more space for arranging conductive lines, a distance from the via hole V9 to the first initialization signal line INT1 is equal to a distance from the via hole V10 to the first initialization signal line INT1.

In some embodiments of the present disclosure, as illustrated in FIG. 3, FIG. 9, FIG. 11, FIG. 15 and FIG. 16, the data line DT includes a first data line DT1 and a second data line DT2, and the first data line DT1 extends in the second direction Y, the second data line DT2 includes the first portion DT2a extending in the first direction X, and the first portion DT2a of the second data line DT2 is located between the first initialization signal line INT1 and the connection electrode E8. As illustrated in FIG. 3 and FIG. 16, the first portion DT2a of the second data line DT2 is also located between the first initialization signal line INT1 and the connection electrode E7. Thus, the arrangement position of the first portion DT2a of the second data line DT2 is determined.

Referring to FIG. 1E, the second portion DT2b of the second data line DT2 and the third portion DT2c of the second data line DT2 are connected by the first portion DT2a of the second data line DT2, and both the second portion DT2b and the third portion DT2c extend in the second direction Y.

In some embodiments of the present disclosure, in order to facilitate the formation of a high-frequency display panel, the data line DT and the first power supply line PL1 are located in the same layer, so that the first portion DT2a of the second data line DT is disposed in the third conductive layer LY3, so as to provide the arrangement position for the first portion DT2a of the second data line DT, and to provide the arrangement space for the data line disposed in the first display region and winding around the second display region.

In some embodiments of the present disclosure, as illustrated in FIG. 1D, the display panel includes the first display region R1 and the second display region R2, the first display region R1 is located on at least one side of the second display region R2, and the pixel unit 100 includes the first pixel unit 101 and the second pixel unit 102, the pixel circuit 100a and the light-emitting element 100b of the first pixel unit 101 are both located in the first display region R1, the pixel circuit 100a of the second pixel unit 102 is located in the first display region R1, the light-emitting element 100b of the second pixel unit 102 is located in the second display region R2, and the pixel circuit 100a of the second pixel unit 102 is connected to the light-emitting element 100b of the second pixel unit 102 through the conductive line L1.

For example, in some embodiments, the first reset control signal line and the gate line of the same pixel unit may be connected to each other, so that the first reset control signal line and the gate line of the same the pixel unit may be input with the same signal. For example, in some embodiments, the second reset control signal line may be connected to the gate line in a next pixel unit, so that the second reset control signal line and the gate line in the next pixel unit may be input with the same signal.

Figure 17:
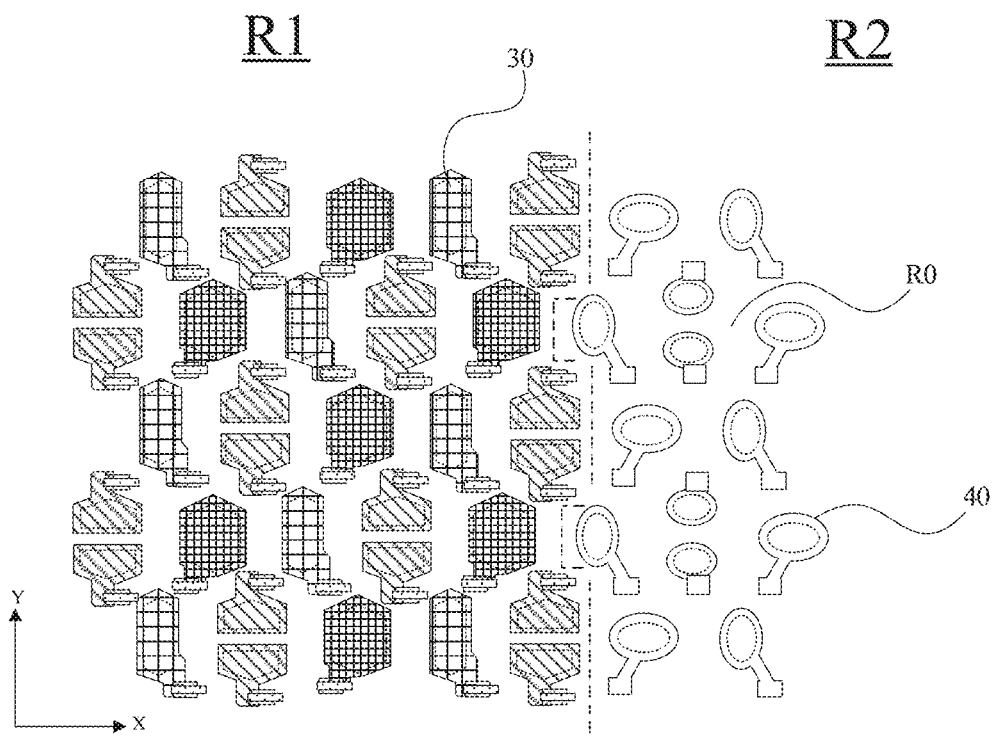
FIG. 17 is a schematic diagram of a first display region and a second display region in the display panel provided by an embodiment of the present disclosure.

FIG. 17 is a schematic diagram of the first display region and the second display region in the display panel provided by an embodiment of the present disclosure. As illustrated in FIG. 17, in the second display region R2, a light transmission region R0 is provided between adjacent second light-emitting elements 40. For example, as illustrated in FIG. 17, a plurality of light transmission regions R0 are connected to each other to form continuous light transmission regions separated by the plurality of second light-emitting elements 40. The conductive line L1 is made of a transparent conductive material to improve a light transmittance of the light transmission region R0 as much as possible. As illustrated in FIG. 17, the region of the second display region R2 except where the second light-emitting element 40 is disposed may be all light transmission regions.

For example, in order to improve the display effect, the density of the second light-emitting elements 40 may be equal to the density of the first light-emitting elements 30. That is, a resolution of the second display region R2 is the same as a resolution of the first display region R1. Of course, in other embodiments, the density of the second light-emitting elements 40 may be greater or less than that of the first light-emitting elements 30. That is, the resolution of the second display region R2 may be larger or smaller than that of the first display region R1. For example, as illustrated in FIG. 17, a light-emitting area of the second light-emitting element 40 is smaller than a light-emitting area of the first light-emitting element 30. FIG. 17 illustrates the light-emitting area of the second light-emitting element 40 and the light-emitting area of the first light-emitting element 30 with dotted lines. For example, the light-emitting area of the light-emitting element may correspond to the area of an opening of a pixel definition layer.

Figure 18:
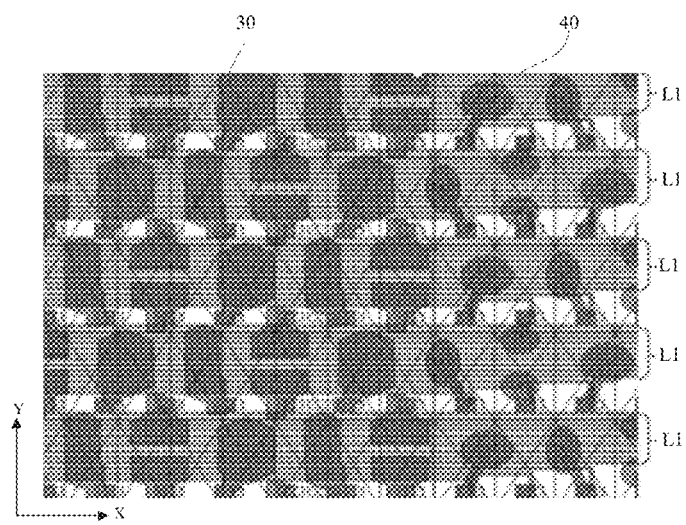
FIG. 18 is a schematic diagram of the conductive line in the display panel provided by an embodiment of the present disclosure.
Figure 19:
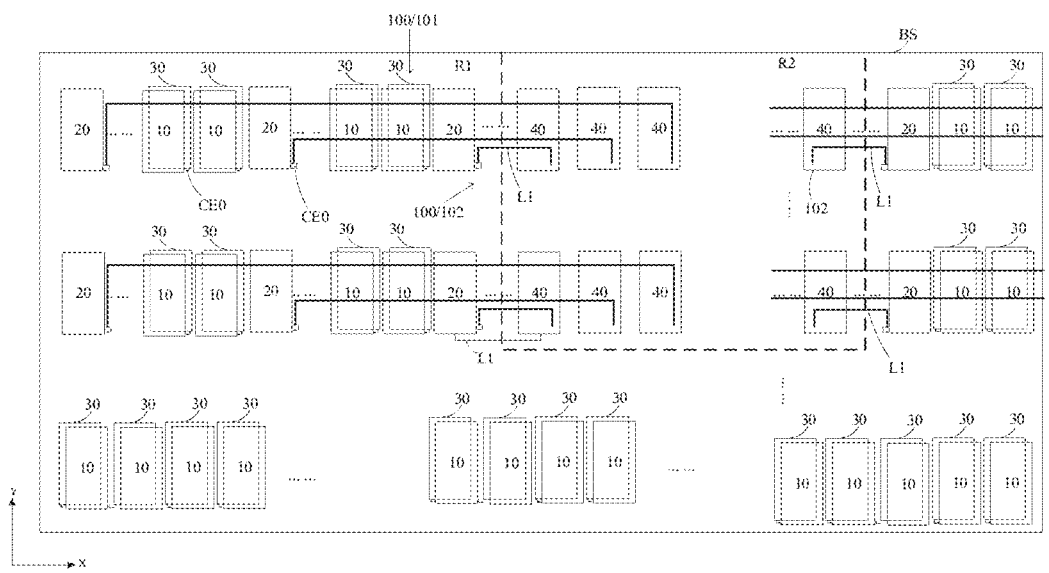
FIG. 19 is a schematic diagram of a display panel.
Figure 20:
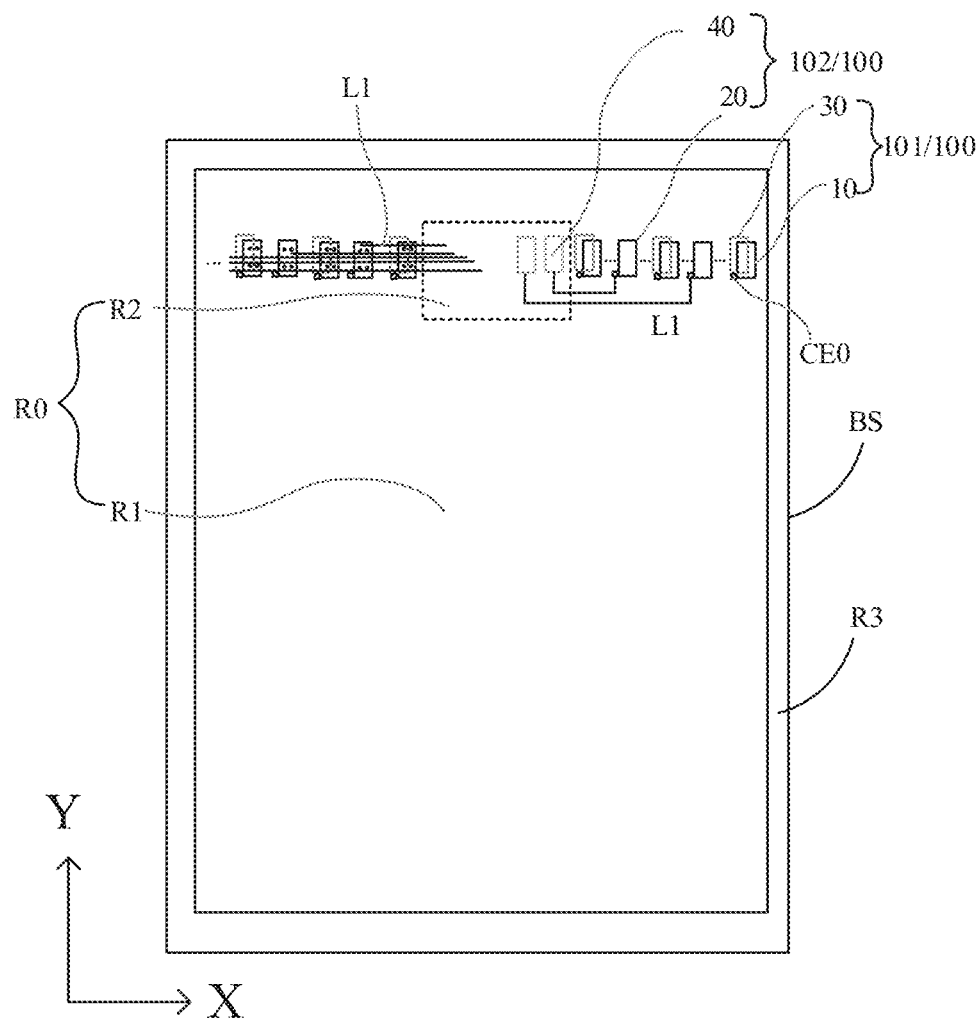
FIG. 20 is a schematic diagram of the conductive line in the display panel provided by an embodiment of the present disclosure.
Figure 21:
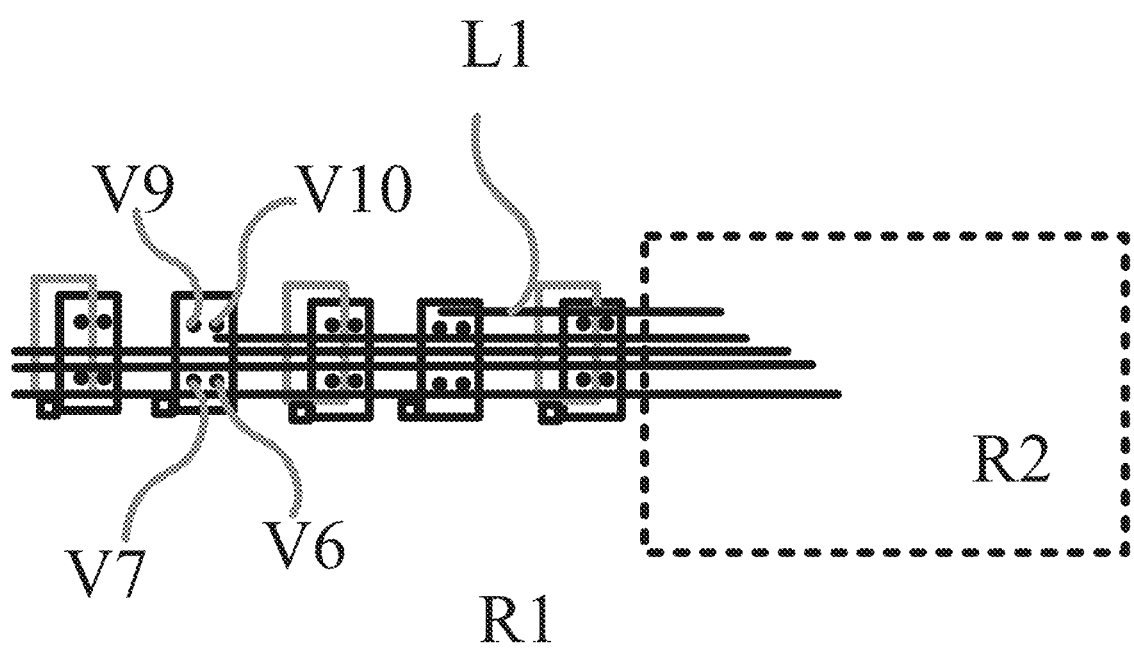
FIG. 21 is a partial enlarged view of FIG. 20.

FIG. 18 is a schematic diagram of the conductive line in the display panel provided by an embodiment of the present disclosure. FIG. 19 is a schematic diagram of the display panel. FIG. 20 is a schematic diagram of the conductive line in the display panel provided by an embodiment of the present disclosure. FIG. 21 is a partial enlarged view of FIG. 20. FIG. 18, FIG. 20 and FIG. 21 illustrate the plurality of conductive lines L1.

FIG. 19 and FIG. 20 illustrate the first light-emitting element 30, the second light-emitting element 40, the first pixel circuit 10, the second pixel circuit 20, a connection element CEO, and the conductive line LL. Each pixel circuit is connected to the light-emitting element through the connection element CEO. That is, each pixel unit includes one connection element CEO. That is, the first pixel circuit 10 is connected to the first light-emitting element 30 through the connection element CEO, and the second pixel circuit 20 is connected to the second light-emitting element 40 through the connection element CEO. For example, one end of the conductive line L1 is connected to the second pixel circuit 20 through the connection element CEO, and another end of the conductive line L1 is connected to the second light-emitting element 40.

As illustrated in FIG. 19, the conductive line L1 passes through the region where the pixel circuit of the pixel unit is located to connect to the second pixel circuit 20 and the second light-emitting element 40 on two sides of the pixel unit, respectively. For example, the region where the pixel circuit of the pixel unit is located overlaps with a plurality of conductive lines L1 passing through the region, the pixel circuit is coupled with the conductive lines overlapping with the pixel circuit to form a parasitic capacitance, resulting in differences in brightness and display defects such as forming stripes (Mura). Because of a coupling between the conductive line and the pixel circuit, it is easy to cause a phenomenon that the brightness of some regions of the display panel is dark, and a dark pixel unit is the pixel unit (first pixel unit) in the first display region, not second light-emitting element 40 in the second display region R2. For example, a dark brightness is more obvious at a high gray scale than at a low gray scale. FIG. 19 takes the case where one first pixel circuit 10 overlaps with at most two conductive lines L1 as an example. In other embodiments, one first pixel circuit 10 may further overlap with more conductive lines L1. For example, as illustrated in FIG. 18, in some embodiments, one first pixel circuit 10 may overlap with 10-15 conductive lines L1. The number of the conductive lines L1 one first pixel circuit 10 overlaps with can be determined as required.

In the embodiment of the present disclosure, in order to solve the situation that the brightness of a part of the display panel is dark, the shield electrode SE is provided, and the shield electrode SE is located between the conductive line L1 and the gate signal portion PT1. For example, in some embodiments, the shield electrode SE is located between the conductive line L1 and the gate electrode T10 of the driving transistor. The shield electrode SE is provided to play a better shielding role, which is conducive to improving a brightness uniformity of the display panel and improving the display effect.

In some embodiments, the region where the second pixel circuit 20 is disposed may be obtained by compressing the size of the first pixel circuits 10 in the first direction X. For example, as illustrated in FIG. 19, in the first display region, a column of the second pixel circuits 20 is disposed every other predetermined column of first pixel circuits 10. For example, the number of columns of the first pixel circuits 10 between two adjacent columns of the second pixel circuits 20 may be determined as required. In some embodiments of the present disclosure, as illustrated in FIG. 20 and FIG. 21, in order to avoid broken or thinning of the conductive line, an orthographic projection of the conductive line L1 on the base substrate BS partially overlaps with an orthographic projection of the pixel circuit 100a of the first pixel unit 101 on the base substrate BS.

In some embodiments of the present disclosure, as illustrated in FIG. 20 and FIG. 21, in order to avoid broken or thinning of the conductive line, an orthographic projection of at least one of the via hole V10, the via hole V9, the via hole V7, and the via hole V6 on the base substrate BS does not overlap with the orthographic projection of the conductive line L1 on the base substrate BS. That is, the conductive line L1 is disposed to avoid at least one of the via hole V10, the via hole V9, the via hole V7, and the via hole V6.

In some embodiments, the orthographic projections of the via hole V10, the via hole V9, the via hole V7, and the via hole V6 on the base substrate BS do not overlap with the orthographic projection of the conductive line L1 on the base substrate BS.

In some embodiments, as illustrated in FIG. 3, one pixel unit includes only four via holes of the via hole V10, the via hole V9, the via hole V7, and the via hole V6 penetrating the fourth insulating layer, so as to arrange more conductive lines L1.

For example, as illustrated in FIG. 3, the via hole V10, the via hole V9, the via hole V7, and the via hole V6 are arranged in two rows. For example, as illustrated in FIG. 3, the via hole V10, the via hole V9, the via hole V7, and the via hole V6 are arranged in two rows in the lateral direction. For example, as illustrated in FIG. 3, a connection line of the two via holes in each row extends in the first direction X. For example, as illustrated in FIG. 3, a connection line of the via hole V10 and the via hole V9 extends in the first direction X, and a connection line of the via hole V7 and the via hole V6 extends in the first direction X.

As illustrated in FIG. 2 and FIG. 3, the display panel includes the gate line GT, the data line DT, the first power supply line PL1, the second power supply line PL2, the light-emitting control signal line EML, the initialization signal line INT, the reset control signal line RST, and so on. For example, the reset control signal line RST includes the first reset control signal line RST1 and the second reset control signal line RST2. The first power supply line PL1 is configured to provide a constant first voltage signal VDD to the pixel unit 100, the second power supply line PL2 is configured to provide a constant second voltage signal VSS to the pixel unit 100, and the first voltage signal VDD is greater than the second voltage signal VSS. The gate line GT is configured to provide a scan signal SCAN to the pixel unit 100, the data line DT is configured to provide a data signal DATA (data voltage VDATA) to the pixel unit 100, and the light-emitting control signal line EML is configured to provide a light-emitting control signal EM to the pixel unit 100. The first reset control signal line RST1 is configured to provide a first reset control signal RESET1 to the pixel unit 100, and the second reset control signal line RST2 is configured to provide the scan signal SCAN to the pixel unit 100. The first initialization signal line INT1 is configured to provide the first initialization signal Vinit1 to the pixel unit 100, and the second initialization signal line INT2 is configured to provide the second initialization signal Vinit2 to the pixel unit 100. For example, the first initialization signal Vinit1 and the second initialization signal Vinit2 are constant voltage signals, for example, the magnitude of the first initialization signal Vinit1 and the second initialization signal Vinit2 may be between the first voltage signal VDD and the second voltage signal VSS, but is not limited thereto. For example, the first initialization signal Vinit1 and the second initialization signal Vinit2 may both be less than or equal to the second voltage signal VSS. For example, in some embodiments, the first initialization signal line INT1 and the second initialization signal line INT2 are connected with each other, and both are configured to provide the initialization signal Vinit to the pixel unit 100, that is, the first initialization signal line INT1 and the second initialization signal line INT2 are both referred to as an initialization signal line INT, the first initialization signal Vinit1 and the second initialization signal Vinit2 are equal, and both are Vinit, but not limited thereto. In other embodiments, the first initialization signal line INT1 and the second initialization signal line INT2 are insulated from each other to provide signals, respectively.

As illustrated in FIG. 2 and FIG. 3, the driving transistor T1 is electrically connected to the light-emitting element 100b, and outputs a driving current under the control of the scan signal SCAN, the data signal DATA, the first voltage signal VDD, the second voltage signal VSS and other signals to drive the light-emitting element 100b to emit light.

For example, the light-emitting element 100b includes an organic light-emitting diode (OLED), and under the driving of the corresponding pixel circuit 100a, the light-emitting element 100b emits red light, green light, blue light, or white light, and so on. For example, one pixel includes a plurality of pixel units. One pixel may include a plurality of pixel units that emit light of different colors. For example, one pixel includes a pixel unit that emits red light, a pixel unit that emits green light, and a pixel unit that emits blue light, but not limited thereto. The number of pixel units included in a pixel and the light-exiting condition of each pixel unit can be determined as required.

For example, as illustrated in FIG. 2 and FIG. 3, a gate electrode T20 of the data writing transistor T2 is connected to the gate line GT, a first electrode T21 of the data writing transistor T2 is connected to the data line DT, and a second electrode T22 of the data writing transistor T2 is connected to a first electrode T11 of the driving transistor T1.

For example, as illustrated in FIG. 2 and FIG. 3, the pixel circuit 100a further includes the threshold compensation transistor T3, a gate electrode T30 of the threshold compensation transistor T3 is connected to the gate line GT, and a first electrode T31 of the threshold compensation transistor T3 is connected to a second electrode T12 of the driving transistor T1, and a second electrode T32 of the threshold compensation transistor T3 is connected to the gate electrode T10 of the driving transistor T1.

For example, as illustrated in FIG. 2 and FIG. 3, the display panel further includes the light-emitting control signal line EML, the pixel circuit 100a further includes a first light-emitting control transistor T4 and a second light-emitting control transistor T5, and a gate electrode T40 of the first light-emitting control transistor T4 is connected to the light-emitting control signal line EML, a first electrode T41 of the first light-emitting control transistor T4 is connected to the first power supply line PL1, and a second electrode T42 of the first light-emitting control transistor T4 is connected to the first electrode T11 of the driving transistor T1. A gate electrode T50 of the second light-emitting control transistor T5 is connected to the light-emitting control signal line EML, a first electrode T51 of the second light-emitting control transistor T5 is connected to the second electrode T12 of the driving transistor T1, and the second electrode T52 of the second light-emitting control transistor T5 is connected to the first electrode Ea of the light-emitting element 100b.

As illustrated in FIG. 2 and FIG. 3, the first reset transistor T6 is connected to the gate electrode T10 of the driving transistor T1, and is configured to reset the gate electrode of the driving transistor T1. The second reset transistor T7 is connected to the first electrode Ea of the light-emitting element 100b, and is configured to reset the first electrode Ea of the light-emitting element 100b. The first initialization signal line INT1 is connected to the gate electrode of the driving transistor T1 through the first reset transistor T6. The second initialization signal line INT2 is connected to the first electrode Ea of the light-emitting element 100b through the second reset transistor T7. For example, the first initialization signal line INT1 and the second initialization signal line INT2 are connected to each other and are input with the same initialization signal, but not limited thereto, in some embodiments, the first initialization signal line INT1 and the second initialization signal line INT2 can also be insulated from each other and configured to input signals, separately.

For example, as illustrated in FIG. 2 and FIG. 3, the first electrode T61 of the first reset transistor T6 is connected to the first initialization signal line INT1, the second electrode T62 of the first reset transistor T6 is connected to the gate electrode T10 of the driving transistor T1. The first electrode T71 of the second reset transistor T7 is connected to the second initialization signal line INT2, and the second electrode T72 of the second reset transistor T7 is connected to the first electrode Ea of the light-emitting element 100b. For example, as illustrated in FIG. 2 and FIG. 3, the gate electrode T60 of the first reset transistor T6 is connected to the first reset control signal line RST1, and the gate electrode T70 of the second reset transistor T7 is connected to the second reset control signal line RST2.

As illustrated in FIG. 2 and FIG. 3, the first power supply line PL1 is configured to provide the first voltage signal VDD to the pixel circuit 100a, and the pixel circuit further includes a storage capacitor Cst, the first electrode Ca of the storage capacitor Cst is connected to the gate electrode T10 of the driving transistor T1, and the second electrode Cb of the storage capacitor Cst is connected to the first power supply line PL1.

For example, as illustrated in FIG. 2 and FIG. 3, the display panel further includes a second power supply line PL2, and the second power supply line PL2 is connected to a second electrode Eb of the light-emitting element 100b.

FIG. 2 illustrates the first node N1, a second node N2, a third node N3, and a fourth node N4. For example, in some embodiments, referring to FIG. 18 and FIG. 19, a capacitor is formed between the first node N1 and the conductive line L1, and a capacitor is formed between the conductive line L1 and the fourth node N4. The conductive line L1 is coupled with the first node N1 and the fourth node N4, respectively, resulting in brightness differences and display defects (for example, forming stripes (Mura)), which affects the display quality. In the embodiments of the present disclosure, the shield electrode SE is provided to reduce the brightness differences and improve display quality.

Figure 22:
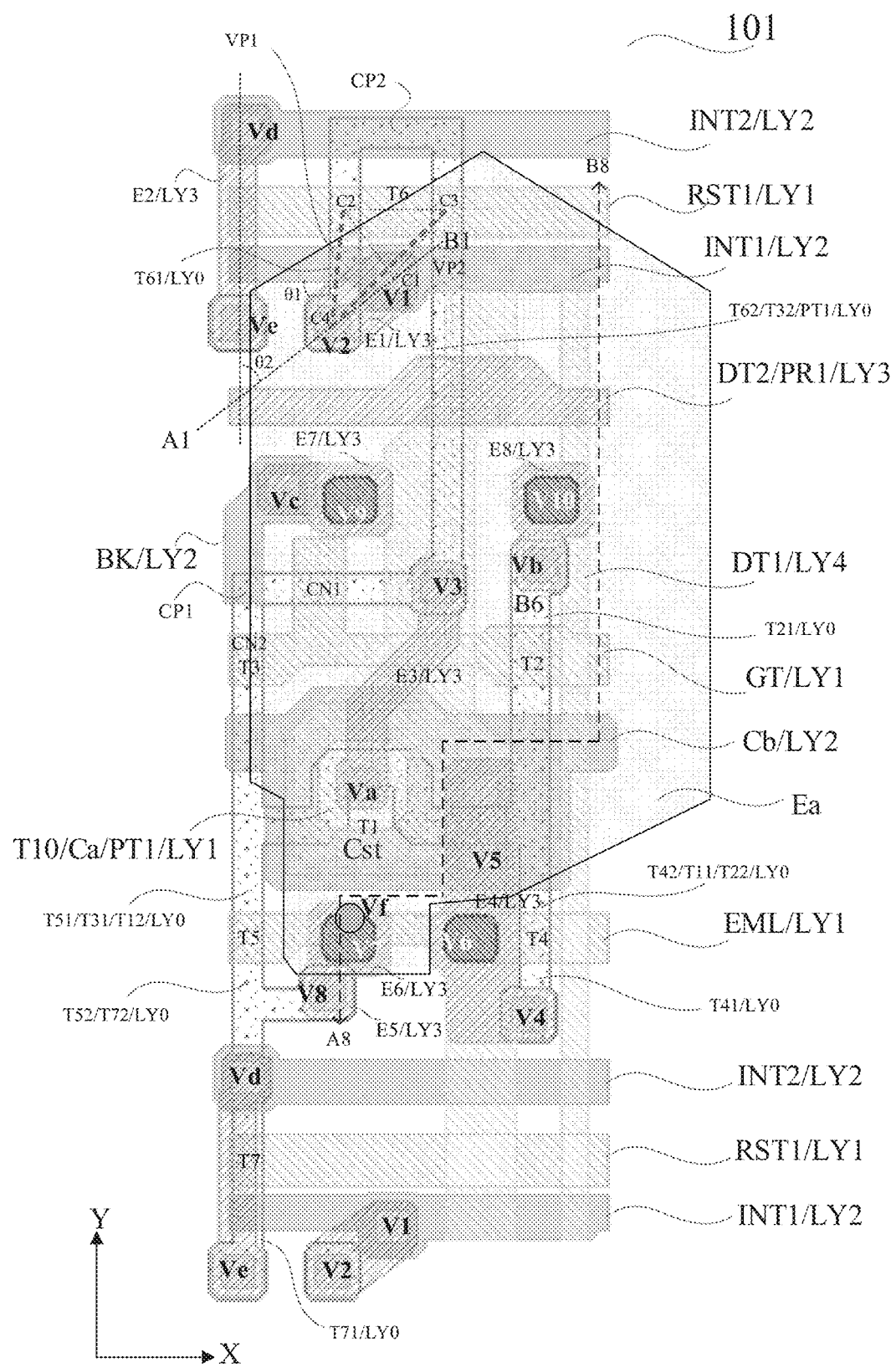
FIG. 22 is a schematic diagram of a first pixel unit in a display panel.
Figure 23:
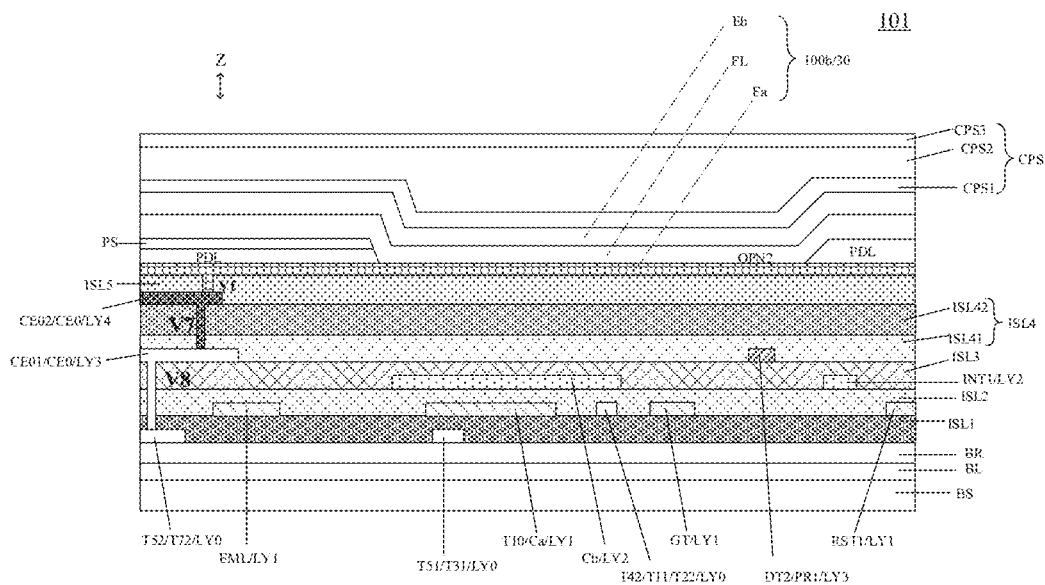
FIG. 23 is a cross-sectional view taken along line A8-B8 of FIG. 22.

FIG. 22 is a schematic diagram of a first pixel unit in the display panel. FIG. 23 is a cross-sectional view taken along line A8-B8 of FIG. 22.

Referring to FIG. 4A to FIG. 4F and FIG. 23, a buffer layer BL is disposed on the base substrate BS, an isolation layer BR is disposed on the buffer layer BL, an active layer LY0 is disposed on the isolation layer BR, and the first insulating layer ISL1 is disposed on the active layer LY0, the first conductive layer LY1 is disposed on the first insulating layer ISL1, the second insulating layer ISL2 is disposed on the first conductive layer LY1, the second conductive layer LY2 is disposed on the second insulating layer ISL2, the third insulating layer ISL3 is disposed on the second conductive layer LY2, the third conductive layer LY3 is disposed on the third insulating layer ISL3, and the third conductive layer LY3 includes a connection electrode CE01, and the connection electrode CE01 is connected to the second electrode T52 of the second light-emitting control transistor T5 through a via hole H3 penetrating the first insulating layer ISL1, the second insulating layer ISL2, and the third insulating layer ISL3. The fourth insulating layer ISL4 and the fifth insulating layer ISL5 are disposed on the third conductive layer LY3, and the fourth conductive layer LY4 is disposed on the fourth insulating layer ISL4 and the fifth insulating layer ISL5. The fourth conductive layer LY4 includes a connection electrode CE02, the connection electrode CE02 is connected to the connection electrode CE01 through a via hole V32 penetrating the fourth insulating layer ISL4, and the fifth insulating layer ISL5 is disposed on the fourth conductive layer LY4. The light-emitting element 100b (the second light-emitting element 30) is connected to the connection electrode CE02 through a via hole Vf (insulated in FIG. 22 and FIG. 23) penetrating the fifth insulating layer ISL5. The light-emitting element 100b includes the first electrode Ea, the second electrode Eb, and a light-emitting functional layer FL between the first electrode Ea and the second electrode Eb. For example, the connection element CE0 includes the connection electrode CE01 and the connection electrode CE02.

For example, the connection electrode CE01 is the connection electrode E5, and the connection electrode CE02 is the connection electrode E6.

As illustrated in FIG. 3, one end of the connection electrode E3 is connected to the gate electrode T10 of the driving transistor T1 through a via hole Va, and another end of the connection electrode E3 is connected to the second electrode T62 of the first reset transistor T6 through the via hole V3. One end of the connection electrode E1 is connected to the first initialization signal line INL1 through the via hole V1, and another end of the connection electrode E1 is connected to the first electrode T61 of the first reset transistor T6 through the via hole V2. One end of the connection electrode E2 is connected to the second initialization signal line INL2 through a via hole Vd, and another end of the connection electrode E2 is connected to the first electrode T71 of the second reset transistor T7 through a via hole Ve. The first power supply line PL1 is connected to the connection electrode E4 through the via hole V6, the connection electrode E4 is connected to the first electrode T41 of the first light-emitting control transistor T4 through the via hole V4. The connection electrode E4 is connected to the second electrode Cb of the storage capacitor Cst through the via hole V5. The first power supply line PL1 is connected to the second electrode Cb of the storage capacitor Cst through the connection electrode E4. The first power supply line PL1 is connected to the block BK through the connection electrode E. The first power supply line PL1 is connected to the connection electrode E7 through the via hole V9, and the connection electrode E7 is connected to the block BK through the via hole Vc. The data line DT is connected to the first electrode T21 of the data writing transistor T2 through the connection electrode E8. The data line DT is connected to the connection electrode E8 through the via hole V10, and the connection electrode E8 is connected to the first electrode T21 of the data writing transistor T2 through the via hole Vb.

Figure 5:
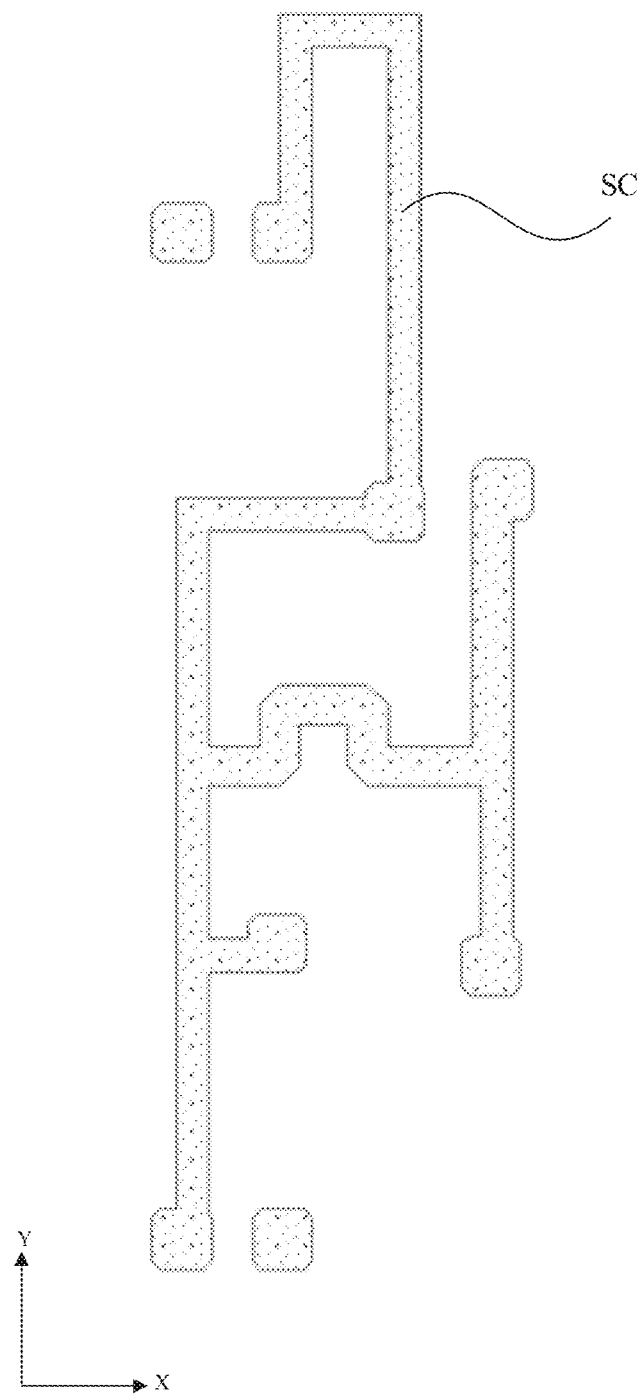
FIG. 5 to FIG. 16 are plan views of a single-layer structure or a multi-layer structure in the display panel illustrated in FIG. 3.

For example, as illustrated in FIG. 12, in a manufacturing process of the display panel, a self-aligned process is adopted, and a semiconductor pattern layer SC (as illustrated in FIG. 5) is subject to a converting-into-conductor treatment by using the first conductive layer LY1 as a mask. The semiconductor pattern layer can be formed by patterning a semiconductor film. For example, the semiconductor pattern layer is heavily doped by ion implantation, so that the portion of the semiconductor pattern layer that is not covered by the first conductive layer LY1 is converted into conductor, so as to form a source electrode region (the first electrode T11) and a drain electrode region (the second electrode T12) of the driving transistor T1, a source electrode region (the first electrode T21) and a drain electrode region (the second electrode T22) of the data writing transistor T2, a source electrode region (the first electrode T31) and a drain electrode region (the second electrode T32) of the threshold compensation transistor T3, a source electrode region (the first electrode T41) and a drain electrode region (the second electrode T42) of the first light-emitting control transistor T4, a source electrode region (the first electrode T51) and a drain electrode region (the second electrode T52) of the second light-emitting control transistor T5, a source electrode region (the first electrode T61) and a drain electrode region (the second electrode T62) of the first reset transistor T6, and a source electrode region (the first electrode T71) and a drain electrode region (the second electrode T72) of the second reset transistor T7. A portion of the semiconductor pattern layer covered by the first conductive layer LY1 retains semiconductor characteristics, so as to form a channel region T13 of the driving transistor T1, a channel region T23 of the data writing transistor T2, a channel region T33 of the threshold compensation transistor T3, a channel region T43 of the first light-emitting control transistor T4, a channel region T53 of the second light-emitting control transistor T5, a channel region T63 of the first reset transistor T6, and a channel region T73 of the second reset transistor T7. For example, as illustrated in FIG. 3, the second electrode T72 of the second reset transistor T7 and the second electrode T52 of the second light-emitting control transistor T5 are integrally formed. The first electrode T51 of the second light-emitting control transistor T5, the second electrode T12 of the driving transistor T1, and the first electrode T31 of the threshold compensation transistor T3 are integrally formed. The first electrode T11 of the driving transistor T1, the second electrode T22 of the data writing transistor T2, and the second electrode T42 of the first light-emitting control transistor T4 are integrally formed. The second electrode T32 of the threshold compensation transistor T3 and the second electrode T62 of the first reset transistor T6 are integrally formed. In some embodiments, as illustrated in FIG. 3, the first electrode T71 of the second reset transistor T7 and the first electrode T61 of the first reset transistor T6 can be integrally formed.

For example, the channel regions of the transistors used in the embodiments of the present disclosure can adopt monocrystalline silicon, poly-crystalline silicon (such as low temperature poly-silicon), or metal oxide semiconductor materials (such as IGZO, AZO, etc.). In one embodiment, the transistors are all P-type low temperature poly-silicon (LTPS) thin film transistors. In another embodiment, the threshold compensation transistor T3 and the first reset transistor T6, that are directly connected to the gate electrode of the driving transistor T1, are metal oxide semiconductor thin film transistors, that is, channel material of the threshold compensation transistor T3 and the first reset transistor T6 is metal oxide semiconductor material (such as IGZO, AZO, etc.). The metal oxide semiconductor thin film transistor has a lower leakage current, which can be conducive to reducing the leakage current of the gate electrode of the driving transistor T1.

For example, the transistors adopted in the embodiments of the present disclosure include various structures, such as a top-gate type, a bottom-gate type, or a dual-gate structure. In one embodiment, the threshold compensation transistor T3 and the first reset transistor T6, which are directly connected to the gate electrode of the driving transistor T1, are dual-gate thin film transistors, which can be conducive to reducing the leakage current of the gate electrode of the driving transistor T1.

For example, as illustrated in FIG. 22 and FIG. 23, the first electrode Ea of the light-emitting element is connected to the connection element CEO through the via hole Ve.

For example, as illustrated in FIG. 23, the display panel further includes a pixel definition layer PDL and a spacer PS. The pixel definition layer PDL has an opening OPN2, and the opening OPN2 is configured to define the light-emitting area (light-exiting region, effective emission region) of the pixel unit. The spacer PS is configured to support a fine metal mask when forming the light-emitting functional layer FL.

For example, the opening OPN2 is the light-exiting region of the pixel unit. The light-emitting functional layer FL is located on the first electrode Ea of the light-emitting element 100b, and the second electrode Eb of the light-emitting element 100b is located on the light-emitting functional layer FL. As illustrated in FIG. 23, an encapsulation layer CPS is disposed on the light-emitting element 100b. The encapsulation layer CPS includes a first encapsulation layer CPS1, a second encapsulation layer CPS2, and a third encapsulation layer CPS3. For example, the first encapsulation layer CPS1 and the third encapsulation layer CPS3 are inorganic material layers, and the second encapsulation layer CPS2 is an organic material layer. For example, the first electrode Ea is the anode of the light-emitting element 100b, and the second electrode Eb is the cathode of the light-emitting element 100b, but not limited thereto.

As illustrated in FIG. 3-FIG. 16 and FIG. 22, the channel of each transistor as well as the first electrode and the second electrode on both sides of the channel are located in the active layer LY0. The first reset control signal line RST1, the gate line GT, the gate electrode T10 of the driving transistor (the first electrode Ca of the storage capacitor Cst), the light-emitting control signal line EML, and the second reset control signal line RST2 are located in the first conductive layer LY1. The first initialization signal line INL1, the second electrode Cb of the storage capacitor Cst, the second initialization signal line INL2, and the block BK are located in the second conductive layer LY2. The first portion DT2a of the second data line DT, the connection electrode E1 to the connection electrode E5, the connection electrode E7, and the connection electrode E8 are located in the third conductive layer LY3; the first data line DT1, the first power supply line PL1, the connection electrode E6, and the shield electrode SE are located in the fourth conductive layer LY4.

As illustrated in FIG. 3-FIG. 16 and FIG. 22, the first initialization signal line INL1, the first reset control signal line RST1, the gate line GT, the light-emitting control signal line EML, the second initialization signal line INL2, and the second reset control signal line RST2 all extend in the first direction X, the first portion DT2a of the second data line DT extends in the first direction X. As illustrated in FIG. 3-FIG. 16 and FIG. 22, the first data line DT1 and the first power supply line PL1 both extend in the second direction Y.

In the embodiments of the present disclosure, the case where an orthographic projection of an element A on the base substrate BS falls within an orthographic projection of an element B on the base substrate BS refers to that the orthographic projection of the element A on the base substrate BS completely falls into the orthographic projection of the element B on the base substrate BS, that is, the orthographic projection of the element B on the base substrate BS covers the orthographic projection of the element A on the base substrate BS, and the area of the orthographic projection of the element A on the base substrate BS is less than or equal to the area of the orthographic projection of the element B on the base substrate BS.

For example, the transistors in the pixel circuit of the embodiments of the present disclosure are all thin film transistors. For example, the first conductive layer LY1, the second conductive layer LY2, the third conductive layer LY3, and the fourth conductive layer LY4 are all made of metal material. For example, the first conductive layer LY1 and the second conductive layer LY2 are formed of metal material such as nickel and aluminum, etc., but are not limited thereto. For example, the third conductive layer LY3 and the fourth conductive layer LY4 are formed of material such as titanium, aluminum, etc., but are not limited thereto. For example, both the third conductive layer LY3 and the fourth conductive layer LY4 are structures of three sub-layers of Ti/AL/Ti, respectively, but are not limited thereto. For example, the base substrate is a glass substrate or a polyimide substrate, but is not limited to this, and can be selected as required. For example, the buffer layer BL, the isolation layer BR, the first insulating layer ISL1, the second insulating layer ISL2, the third insulating layer ISL3, the fourth insulating layer IS4, the fifth insulating layer ISL5 are all made of insulating material. The materials of the first electrode Ea and the second electrode Eb of the light-emitting element can be selected as required. In some embodiments, the first electrode Ea adopts at least one of transparent conductive metal oxide and silver, but is not limited thereto. For example, the transparent conductive metal oxide includes indium tin oxide (ITO), but is not limited thereto. For example, the first electrode Ea may adopt a structure in which three sub-layers of ITO-Ag-ITO are disposed in a stack manner. In some embodiments, the second electrode Eb adopts a metal of low work function, for example, at least one of magnesium and silver, but is not limited thereto.

For example, referring to the layout diagrams and the cross-sectional views of the embodiments of the present disclosure, the display panel provided by at least one embodiment of the present disclosure can be manufactured by the following method.

(1) Forming the buffer layer BL and the isolation layer BR on the base substrate BS.

(2) Forming a semiconductor thin film on the isolation layer BR.

(3) Patterning the semiconductor thin film to form a semiconductor pattern layer.

(4) Forming a first insulating film on the semiconductor pattern layer.

(5) Forming a first conductive film on the first insulating film, and patterning the first conductive film to form the first conductive layer LY1.

(6) Performing a doping process on the semiconductor pattern layer by using the first conductive layer LY1 as a mask, so as to form the active layer LY0.

(7) Forming a second insulating film on the first conductive layer LY1.

(8) Forming a second conductive film on the second insulating layer ISL2, and patterning the second conductive film to form the second conductive layer LY2.

(9) Forming a third insulating film on the second conductive layer LY2.

(10) Patterning at least one of the first insulating film, second insulating film, and the third insulating film to form via holes and to simultaneously form the first insulating layer ISL1, the second insulating layer ISL2, and the third insulating layer ISL3.

(11) Forming a third conductive film, and patterning the third conductive film to form the third conductive layer LY3. The components in the third conductive layer LY3 are connected to the components located under the third conductive layer LY3 through the via holes.

(12) Forming a fourth insulating film and a fifth insulating film, and patterning the fourth insulating film and the fifth insulating film to form via holes and to simultaneously form the fourth insulating layer ISL4.

(13) Forming a fourth conductive film, and patterning the fourth conductive film to form the fourth conductive layer LY4.

(14) Forming a sixth insulating film.

(15) Forming at least one insulating material film and forming at least one transparent conductive layer, and the transparent conductive layer including the conductive line L1.

(16) Forming the first electrode Ea of the light-emitting element, and forming the fifth insulating layer and at least one insulating material layer.

(17) Forming a pixel definition layer PDL and forming a spacer PS.

(18) Forming a light-emitting functional layer FL.

(19) Forming a second electrode Eb of the light-emitting element.

(20) Forming an encapsulation layer CPS.

At least one embodiment of the present disclosure provides a display device including any one of the above-mentioned display panels.

Figure 24:
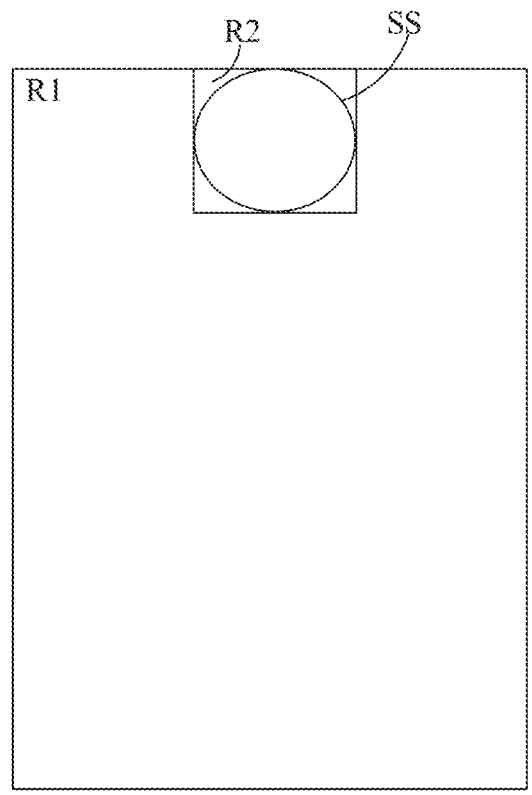
FIG. 24 and FIG. 25 are schematic diagrams of the display device provided by an embodiment of the present disclosure.
Figure 25:
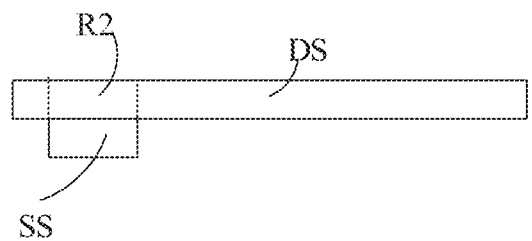

FIG. 24 and FIG. 25 are schematic diagrams of the display device provided by an embodiment of the disclosure. As illustrated in FIG. 24 and FIG. 25, a sensor SS is located on one side of a display substrate DS and located in a second display region R2. The ambient light can propagate through the second display region R2 and can be sensed by the sensor SS. As illustrated in FIG. 25, the side of the display panel where the sensor SS is not provided is a display side, and images can be displayed on the display side.

For example, the display device is a full-screen display device with an under-screen camera. For example, the display device includes an OLED or a product including an OLED. For example, the display device includes products or components with display function including the above-mentioned display panel, such as a TV, a digital camera, a mobile phone, a watch, a tablet computer, a laptop computer, a navigator, and the like.

For example, in the embodiments of the present disclosure, the first direction X and the second direction Y are directions parallel with a main surface of the base substrate, and the third direction Z is a direction perpendicular to the main surface of the base substrate. The main surface of the base substrate is a surface on which various elements are fabricated. An upper surface of the base substrate in the cross-sectional view is the main surface thereof. For example, the first direction X intersects with the second direction Y. For further example, the first direction X is perpendicular to the second direction Y. For example, the first direction X is a row direction of the pixel unit, and the second direction Y is a column direction of the pixel unit, but not limited thereto.

In the display panel provided by the embodiments of the present disclosure, each technical feature with an independent effect can be independent of other technical features. For example, the display panel provided by some embodiments may have at least one of the following conditions, the following conditions may exist independently, or may be arbitrarily combined with other conditions, and an arrangement effect of each component may refer to a corresponding portion.

(1) The first initialization signal line INT1 and the second initialization signal line INT2 are located in the same layer, and are located in a different layer from the first reset control signal line RST1. The orthographic projection of the first reset control signal line RST1 on the base substrate BS is located between the orthographic projection of the first initialization signal line INT1 on the base substrate BS and the orthographic projection of the second initialization signal line INT2 on the base substrate BS.

(2) The via hole V9 and the via hole V10 are arranged in the first direction X, for example, at the same height, or in the lateral direction, so as to have an arrangement direction the same as the extension direction of a portion of the conductive line L1.

(3) The via hole V7 and the via hole V6 are arranged in the first direction X, for example, at the same height, or in the lateral direction, so as to have an arrangement direction the same as the extension direction of a portion of the conductive line L1.

(4) A connection electrode E4 is provided to reduce the number of via holes penetrating the fourth insulating layer.

(5) The first power supply line PL1 is located in the fourth conductive layer, and the shield electrode SE and the first power supply line PL1 are integrally formed to reduce the number of via holes penetrating the fourth insulating layer.

(6) The block BK is configured to block the conductive connection portion CP1 of the pixel unit 100 where it is located.

(7) The connection electrode E1 is inclined.

Figure 26:
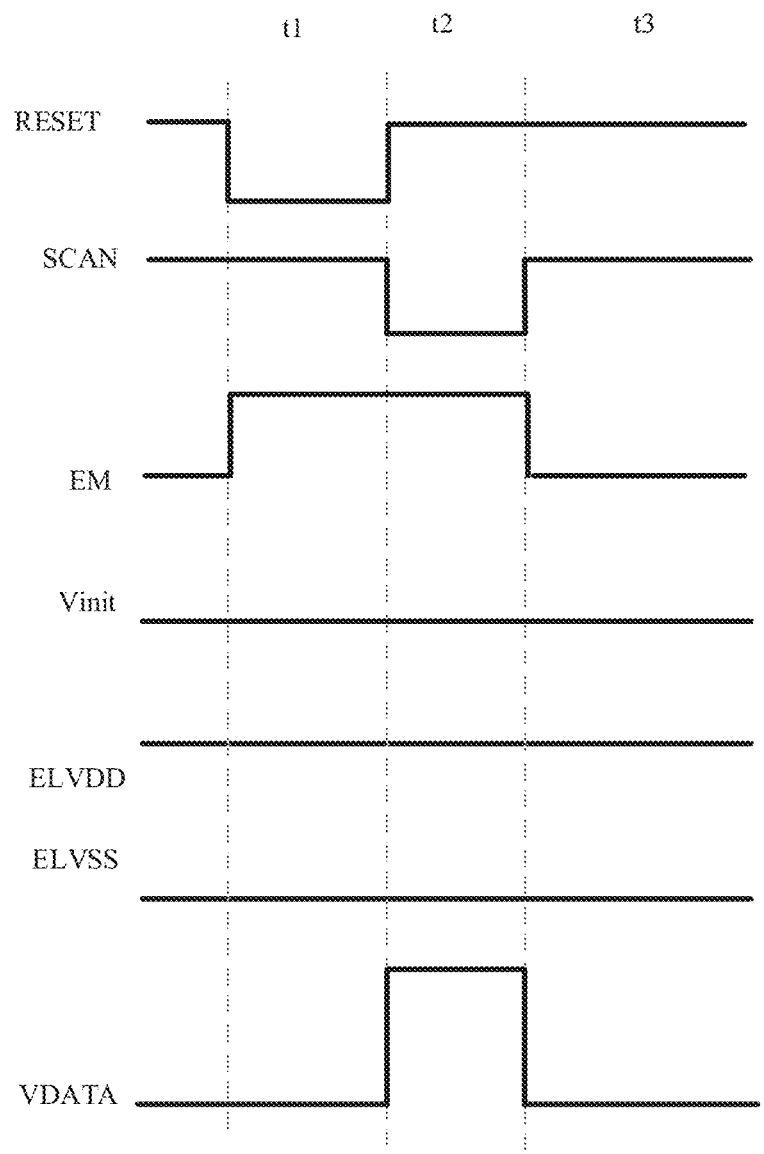
FIG. 26 is a working timing diagram of the pixel circuit illustrated in FIG. 2.

FIG. 26 is a working timing diagram of the pixel circuit illustrated in FIG. 2. As illustrated in FIG. 26, during a display period of one frame, a driving method of the pixel unit includes a first reset phase t1, a data writing and threshold compensation and second reset phase t2, and a light-emitting phase t3. When the reset control signal RESET is at a low level, the gate electrode of the driving transistor T1 is reset, and when the scan signal SCAN is at a low level, the first electrode Ea (for example, the anode) of the light-emitting element 100b is reset. For example, as illustrated in FIG. 2, when the scan signal SCAN is at a low level, the data voltage VDATA is written, and a threshold voltage Vth of the driving transistor T1 is obtained, at the same time, the data voltage VDADA containing a data information on the data line is stored in the capacitor Cst; when the light-emitting control signal line EML is at a low level, the light-emitting element 100b emits light, and the voltage of the first node N1 (gate point) is maintained (light-emitting stability of the light-emitting element 100b) by the storage capacitor Cst. In a driving process of the pixel circuit 10, in a light-emitting phase, the storage capacitor is used to hold the voltage signal, so that the electrical potential of a signal holding end can be kept constant, and a voltage difference is formed between the gate electrode and the source electrode of the driving transistor, thereby controlling the driving transistor to form the driving current to drive the light-emitting element 100b to emit light.

As illustrated in FIG. 26, in the reset phase t1, the light-emitting control signal EM is set to be a turn-off voltage, the reset control signal RESET is set to be a turn-on voltage, and the scan signal SCAN is set to be the turn-off voltage.

As illustrated in FIG. 26, in the data writing and the threshold compensation and second reset phase t2, the light-emitting control signal EM is set to be the turn-off voltage, the reset control signal RESET is set to be the turn-off voltage, and the scan signal SCAN is set to be the turn-on voltage.

As illustrated in FIG. 26, in the light-emitting phase t3, the light-emitting control signal EM is set to be the turn-on voltage, the reset control signal RESET is set to be the turn-off voltage, and the scan signal SCAN is set to be the turn-off voltage.

As illustrated in FIG. 26, a first voltage signal ELVDD and a second voltage signal ELVSS are both constant voltage signals, for example, the initialization signal Vinit is between the first voltage signal ELVDD and the second voltage signal ELVSS.

For example, in the embodiment of the present disclosure, the turn-on voltage refers to a voltage that can cause a first electrode and a second electrode of a corresponding transistor to be turned on, and the turn-off voltage refers to a voltage that can cause a first electrode and a second electrode of a corresponding transistor to be turned off. In the case where the transistor is a transistor of P-type, the turn-on voltage is a low voltage (e.g., 0 V), and the turn-off voltage is a high voltage (e.g., 5 V); in the case where the transistor is a transistor of N-type, the turn-on voltage is a high voltage (e.g., 5 V), and the turn-off voltage is a low voltage (e.g., 0 V). Driving waveforms illustrated in FIG. 26 are all described by taking first reset transistors of P-type as an example, that is, the turn-on voltage is a low voltage (e.g., 0 V), and the turn-off voltage is a high voltage (e.g., 5 V).

Referring to FIG. 2 and FIG. 26 together, in the first reset phase t1, the light-emitting control signal EM is the turn-off voltage, the reset control signal RESET is the turn-on voltage, and the scan signal SCAN is the turn-off voltage. At this time, the first reset transistor T6 is in a turn-on state, and the second reset transistor T7, the data writing transistor T2, the threshold compensation transistor T3, the first light-emitting control transistor T4, and the second light-emitting control transistor T5 are in a turn-off state. The first initialization signal Vinit1 (for example, the initialization voltage Vinit) is transmitted to the gate electrode of the driving transistor T1 by the first reset transistor T6 and then is stored by the storage capacitor Cst, so as to reset the driving transistor T1 and eliminate the data stored during emitting light in the last time (a previous frame).

In the data writing and threshold compensation and second reset phase t2, the light-emitting control signal EM is a turn-off voltage; the reset control signal RESET is a turn-off voltage; and the scan signal SCAN is a turn-on voltage. In this case, the data writing transistor T2 and the threshold compensation transistor T3 are in a turn-on state; the second reset transistor T7 is in a turn-on state; and the second reset transistor T7 transmits the second initialization signal Vint2 (e.g. initialization signal Vint) to the first electrode Ea of the light-emitting element 100b to reset the light-emitting element 100b. While the first light-emitting control transistor T4, the second light-emitting control transistor T5, and the first reset transistor T6 are in a turn-off state. At this time, the data writing transistor T2 transmits the data voltage VDATA to the first electrode of the driving transistor T1, that is, the data writing transistor T2 receives the scan signal SCAN and the data voltage VDATA and writes the data voltage VDATA into the first electrode of the driving transistor T1 according to the scan signal SCAN. The threshold compensation transistor T3 is turned on to connect the driving transistor T1 into a diode structure, so that the gate electrode of the driving transistor T1 can be charged. After the charging is completed, a voltage on gate electrode of the driving transistor T1 is VDATA+Vth, where, VDATA is a data voltage and Vth is a threshold voltage of the driving transistor T1, that is, the threshold compensation transistor T3 receives the scan signal SCAN and performs threshold voltage compensation on the voltage on gate electrode of the driving transistor T1. In this phase, a voltage difference between both ends of the storage capacitor Cst is ELVDD-VDATA-Vth.

In the light-emitting phase t3, the light-emitting control signal EM is a turn-on voltage; the reset control signal RESET is a turn-off voltage; and the scan signal SCAN is a turn-off voltage. The first light-emitting control transistor T4 and the second light-emitting control transistor T5 are in a turn-on state; while the data writing transistor T2, the threshold compensation transistor T3, the first reset transistor T6, and the second reset transistor T7 are in a turn-off state. The first power signal ELVDD is transmitted to the first electrode of the driving transistor T1 through the first light-emitting control transistor T4; the voltage on gate electrode of the driving transistor T1 is maintained at VDATA+Vth; and a light-emitting current I flows into the light-emitting element 100b through the first light-emitting control transistor T4, the driving transistor T1, and the second light-emitting control transistor T5, so that the light-emitting element 100b emits light. That is, the first light-emitting control transistor T4 and the second light-emitting control transistor T5 receive the light-emitting control signal EM, and control the light-emitting element 100b to emit light according to the light-emitting control signal EM. The light-emitting current I satisfies the following saturation current formula:

$$K(Vgs - Vth)^2 =$$
$$K(VDATA + Vth - ELVDD - Vth)^2 = K(VDATA - ELVDD)^2$$
$$\text{Where, } K = 0.5\mu_n Cox \frac{W}{L},$$

$\mu_n$ is channel mobility of the driving transistor, Cox is a channel capacitance per unit area of the driving transistor T1, W and L are a channel width and a channel length of the driving transistor T1, respectively, and Vgs is a voltage difference between the gate electrode and the source electrode (i.e., the first electrode of the driving transistor T1 according to this embodiment) of the driving transistor T1.

It can be seen from the above formula that, the current flowing through the light-emitting element 100b is independent of the threshold voltage of the driving transistor T1. Therefore, the pixel circuit structure is very well compensated for the threshold voltage of the driving transistor T1.

FIG. 26 only illustrated the case where the initialization voltage Vinit, the second initialization signal Vinit2, and the first initialization signal Vinit1 may be different signals. That is, the first initialization signal line INT1 and the second initialization signal line INT2 may be insulated from each other and be input with different signals.

For example, a ratio of duration of the light-emitting phase t3 to a display time period of one frame may be adjusted. In this way, light-emitting brightness may be controlled by adjusting the ratio of the duration of the light-emitting phase t3 to the display time period of one frame. For example, the ratio of the duration of the light-emitting phase t3 to the display time period of one frame is adjusted by controlling the scan driving circuit in the display panel or a driving circuit additionally provided.

For example, the embodiments of the present disclosure are not limited to the specific pixel circuit illustrated in FIG. 2, and other pixel circuit that can implement compensation to the driving transistor may be used. Based on the description and teaching of the implementations of the present disclosure, other arrangements that can be easily conceived by those skilled in the art without any inventive work are within the protection scope of the present disclosure.

The above description takes the pixel circuit of 7T1C as an example, and the embodiments of the present disclosure include but are not limited to this. It should be noted the number of thin film transistors and the number of capacitors included in the pixel circuit are not limited in the embodiments of the present disclosure. For example, in some other embodiments, the pixel circuit of the display panel may further be a structure including transistors of other numbers, such as a 7T2C structure, a 6T1C structure, a 6T2C structure, or a 9T2C structure, which is not limited in the embodiments of the present disclosure. Of course, the display panel may further include pixel circuits with less than 7 transistors.

In the embodiments of the present disclosure, elements located in the same layer may be formed from the same film layer through the same patterning process. For example, elements located in the same layer may be located on a surface of the same element away from the base substrate.

It should be noted that, for the sake of clarity, in the drawings used to describe the embodiments of the present disclosure, the thickness of a layer or region is exlarged. It can be understood that when an element such as a layer, film, region, or substrate is referred to as being "on" or "under" another element, the element can be "directly" "on" or "under" the other element, or there may be intermediate elements.

In the embodiments of the present disclosure, the patterning or patterning process may only include a photolithography process, or include a photolithography process and an etching process, or may include other processes for forming predetermined patterns such as printing process and inkjet process. The photolithography process refers to the process including film formation, exposure, development, etc., using photoresist, mask, exposure machine, etc. to form patterns. The corresponding patterning process can be selected according to the structure formed in the embodiment of the present disclosure.

It should be noted that, in the embodiments of the present disclosure, various similar components may not be numbered sequentially according to an order of appearance, and in claims, the various similar components may be sequentially numbered according to the order of appearance.

The following are two cases numbered sequentially. In other embodiments, various similar components may have other numbering sequences according to the different order of appearance.

For example, in one case, the sequence numbering of via holes V1-V10 and the sequence numbering of connection electrodes E1-E8 are illustrated in Table 1 and Table 2.

TABLE 1

Sequence numbering of the via holes V1-V10

| via hole V1 | via hole V2 | via hole V3 | via hole V4 | via hole V5 | via hole V6 | via hole V7 | via hole V8 | via hole V9 | via hole V10 |
|---|---|---|---|---|---|---|---|---|---|
| ninth via hole | tenth via hole | sixth via hole | first via hole | second via hole | third via hole | fourth via hole | fifth via hole | seventh via hole | eighth via hole |

TABLE 2

Sequence numbering of the connection electrodes E1-E8

| connection electrode E1 | connection electrode E2 | connection electrode E3 | connection electrode E4 | connection electrode E5 | connection electrode E6 | connection electrode E7 | connection electrode E8 |
|---|---|---|---|---|---|---|---|
| seventh connection electrode | eighth connection electrode | fourth connection electrode | first connection electrode | second connection electrode | third connection electrode | fifth connection electrode | sixth connection electrode |

For example, in another case, the sequence numbering of the via holes V1-V10 and the sequence numbering of the connection electrodes E1-E8 are illustrated in Table 3 and Table 4.

TABLE 3

Sequence numbering of the via holes V1-V10

| via hole V1 | via hole V2 | via hole V3 | via hole V4 | via hole V5 | Via hole V6 | via hole V7 | via hole V8 | via hole V9 | via hole V10 |
|---|---|---|---|---|---|---|---|---|---|
| first via hole | second via hole | third via hole | fourth via hole | fifth via hole | sixth via hole | seventh via hole | eighth via hole | ninth via hole | tenth via hole |

TABLE 4

Sequence numbering of the connection electrodes E1-E8

| connection electrode E1 | connection electrode E2 | connection electrode E3 | connection electrode E4 | connection electrode E5 | connection electrode E6 | connection electrode E7 | connection electrode E8 |
|---|---|---|---|---|---|---|---|
| first connection electrode | second connection electrode | third connection electrode | fourth connection electrode | fifth connection electrode | sixth connection electrode | seventh connection electrode | eighth connection electrode |

In the case of no conflict, the features in the same embodiment and different embodiments of the present disclosure can be combined with each other.

The above are only specific embodiments of the present disclosure, but the protection scope of the present disclosure is not limited thereto. Any person skilled in the art can easily think of changes or substitutions within the technical scope disclosed in the present disclosure. It should be covered within the protection scope of the present disclosure. Therefore, the protection scope of the present disclosure should be subject to the protection scope of the claims.

What is claimed is:

1. A display panel, comprising:
a base substrate;
a pixel unit, located on the base substrate, comprising a pixel circuit and a light-emitting element, wherein the pixel circuit is configured to drive the light-emitting element, the pixel circuit comprises a driving transistor, a first reset transistor, and a second reset transistor, the first reset transistor is connected to the driving transistor and is configured to reset a gate electrode of the driving transistor;
a first initialization signal line, connected to a first electrode of the first reset transistor and configured to provide a first initialization signal to the pixel unit;
a first reset control signal line, connected to a gate electrode of the first reset transistor; and
a second initialization signal line, wherein a first electrode of the second reset transistor is connected to the second initialization signal line, a second electrode of the second reset transistor is connected to a first electrode of the light-emitting element, and is configured to reset the first electrode of the light-emitting element,
wherein the first initialization signal line and the second initialization signal line are located in a same layer, and are located in a different layer from the first reset control signal line,
an orthographic projection of the first reset control signal line on the base substrate is located between an orthographic projection of the first initialization signal line on the base substrate and an orthographic projection of the second initialization signal line on the base substrate,
further comprising the display panel further comprises a first power supply line and a first connection electrode, wherein the first power supply line is configured to provide a constant first voltage signal to the pixel unit, the pixel circuit further comprises a first light-emitting control transistor and a storage capacitor, a first electrode of the storage capacitor is connected to the gate electrode of the driving transistor, and a second electrode of the storage capacitor is connected to the first power supply line through the first connection electrode,
the first connection electrode is connected to a first electrode of the first light-emitting control transistor through a first via hole, and the first connection electrode is connected to the second electrode of the storage capacitor through a second via hole.

2. The display panel according to claim 1, further comprising a second connection electrode and a third connection electrode, wherein the first power supply line is connected to the first connection electrode through a third via hole,
the pixel circuit further comprises a second light-emitting control transistor, and a first electrode of the second light-emitting control transistor is connected to the driving transistor,
the third connection electrode is connected to the second connection electrode through a fourth via hole,
the second connection electrode is connected to a second electrode of the second light-emitting control transistor through a fifth via hole, and
the fourth via hole and the third via hole are arranged in a first direction.

3. The display panel according to claim 1, further comprising a fourth connection electrode and a shield electrode, wherein the gate electrode of the driving transistor is connected to a second electrode of the first reset transistor through the fourth connection electrode,
the shield electrode and the first power supply line are of an integral structure, and
an orthographic projection of the shield electrode on the base substrate covers an orthographic projection of the fourth connection electrode on the base substrate.

4. The display panel according to claim 3, wherein the fourth connection electrode is connected to the second electrode of the first reset transistor through a sixth via hole,
the orthographic projection of the shield electrode on the base substrate covers an orthographic projection of the sixth via hole on the base substrate.

5. The display panel according to claim 1, further comprising a data line, a block and a fifth connection electrode, wherein the data line is configured to provide a data signal to the pixel unit, the data line and the first power supply line are located in a same layer,
wherein the pixel circuit further comprises a threshold compensation transistor,
the threshold compensation transistor comprises a first channel, a second channel, and a conductive connection portion connecting the first channel and the second channel,
the fifth connection electrode is connected to the first power supply line through a seventh via hole, and the fifth connection electrode is connected to the block,
an orthographic projection of the block on the base substrate at least partially overlaps with an orthographic projection of the conductive connection portion on the base substrate, and
the block is configured to block the conductive connection portion of the pixel unit where the block is located.

6. The display panel according to claim 5, further comprising a sixth connection electrode, wherein the pixel circuit further comprises a data writing transistor,
the data line is connected to the data writing transistor through the sixth connection electrode,
the sixth connection electrode is connected to the data line through an eighth via hole, and
the seventh via hole and the eighth via hole are arranged in a first direction.

7. The display panel according to claim 6, wherein the display panel comprises a first display region and a second display region, the first display region is located on at least one side of the second display region,
the pixel unit comprises a first pixel unit and a second pixel unit,
both the pixel circuit and the light-emitting element of the first pixel unit are located in the first display region,
the pixel circuit of the second pixel unit is located in the first display region, and the light-emitting element of the second pixel unit is located in the second display region, and
the pixel circuit of the second pixel unit is connected to the light-emitting element of the second pixel unit through a conductive line.

8. The display panel according to claim 7, wherein an orthographic projection of at least one selected from the group consisting of the eighth via hole, the seventh via hole, the fourth via hole, and the third via hole on the base substrate does not overlap with an orthographic projection of the conductive line on the base substrate.

9. A display device, comprising the display panel according to claim 1.

10. The display panel according to claim 1, further comprising a seventh connection electrode, wherein the first initialization signal line is connected to the first electrode of the first reset transistor through the seventh connection electrode, the seventh connection electrode is connected to the first initialization signal line through a ninth via hole, and the seventh connection electrode is connected to the first electrode of the first reset transistor through a tenth via hole,
the first initialization signal line extends in a first direction, and the seventh connection electrode is inclined with respect to the first initialization signal line.

11. A display panel, comprising:
a base substrate;
a pixel unit, located on the base substrate, comprising a pixel circuit and a light-emitting element, wherein the pixel circuit is configured to drive the light-emitting element, the pixel circuit comprises a driving transistor, a first reset transistor, and a second reset transistor, the first reset transistor is connected to the driving transistor and is configured to reset a gate electrode of the driving transistor;
a first initialization signal line, connected to a first electrode of the first reset transistor and configured to provide a first initialization signal to the pixel unit;
a first reset control signal line, connected to a gate electrode of the first reset transistor; and
a second initialization signal line, wherein a first electrode of the second reset transistor is connected to the second initialization signal line, a second electrode of the second reset transistor is connected to a first electrode of the light-emitting element, and is configured to reset the first electrode of the light-emitting element,
wherein the first initialization signal line and the second initialization signal line are located in a same layer, and are located in a different layer from the first reset control signal line,
an orthographic projection of the first reset control signal line on the base substrate is located between an orthographic projection of the first initialization signal line on the base substrate and an orthographic projection of the second initialization signal line on the base substrate,
the display panel further comprises a seventh connection electrode, wherein the first initialization signal line is connected to the first electrode of the first reset transistor through the seventh connection electrode, the seventh connection electrode is connected to the first initialization signal line through a ninth via hole, and the seventh connection electrode is connected to the first electrode of the first reset transistor through a tenth via hole, the first initialization signal line extends in a first direction, and the seventh connection electrode is inclined with respect to the first initialization signal line.

12. The display panel according to claim 11, wherein an included angle between an extension direction of the seventh connection electrode and an extension direction of the first initialization signal line is an acute angle.

13. The display panel according to claim 12, wherein the included angle is greater than or equal to 30 degrees and less than or equal to 60 degrees.

14. The display panel according to claim 11, wherein the first reset transistor comprises a first channel and a second channel, lines connecting centers of the ninth via hole, the first channel, and the second channel form an acute triangle, and lines connecting centers of the tenth via hole, the first channel, and the second channel form an obtuse triangle.

15. The display panel according to claim 11, wherein the first initialization signal line comprises a first overlap portion overlapping with the first electrode of the first reset transistor and a second overlap portion overlapping with a second electrode of the first reset transistor, and the ninth via hole is located between the first overlap portion and the second overlap portion.

16. The display panel according to claim 11, wherein an orthographic projection of the ninth via hole on the base substrate does not overlap with the orthographic projection of the first electrode of the first reset transistor on the base substrate, and does not overlap with an orthographic projection of a second electrode of the first reset transistor on the base substrate.

17. The display panel according to claim 11, wherein the first reset control signal line is located in a first conductive layer, the first initialization signal line and the second initialization signal line are located in a second conductive layer, and the seventh connection electrode is located in a third conductive layer, the first conductive layer is closer to the base substrate than the second conductive layer, and the second conductive layer is closer to the substrate than the third conductive layer.

18. The display panel according to claim 11, further comprising an eighth connection electrode, wherein the eighth connection electrode is connected to the second initialization signal line and the first electrode of the second reset transistor, respectively, and the seventh connection electrode is inclined with respect to the eighth connection electrode.

19. The display panel according to claim 18, wherein an included angle between an extension direction of the seventh connection electrode and an extension direction of the eighth connection electrode is an acute angle.

20. The display panel according to claim 18, wherein the ninth via hole and the eighth connection electrode are disposed on two opposite sides of the first electrode of the first reset transistor, respectively.

* * * * *

UNITED STATES PATENT AND TRADEMARK OFFICE
CERTIFICATE OF CORRECTION

| | |
|---|---|
| PATENT NO. | : 12,243,480 B2 |
| APPLICATION NO. | : 17/997498 |
| DATED | : March 4, 2025 |
| INVENTOR(S) | : Lili Du and Weiyun Huang |

Page 1 of 1

It is certified that error appears in the above-identified patent and that said Letters Patent is hereby corrected as shown below:

In the Claims

In Claim 1, Column 36, Line 52, the text:
"further comprising the display panel further comprises a"
Is replaced with:
--the display panel further comprises a--

Signed and Sealed this
Twenty-fourth Day of June, 2025

Coke Morgan Stewart
*Acting Director of the United States Patent and Trademark Office*